United States Patent
Hillis et al.

(10) Patent No.: US 7,825,364 B1
(45) Date of Patent: Nov. 2, 2010

(54) ELECTROMAGNETIC DEVICE WITH INTEGRAL\NON-LINEAR COMPONENT

(75) Inventors: W. Daniel Hillis, Encino, CA (US); Nathan P. Myhrvold, Medina, WA (US); Clarence T. Tegreene, Bellevue, WA (US); Lowell L. Wood, Jr., Livermore, CA (US)

(73) Assignee: Invention Science Fund I, Bellevue, WA (US)

( * ) Notice: Subject to any disclaimer, the term of this patent is extended or adjusted under 35 U.S.C. 154(b) by 0 days.

(21) Appl. No.: 12/387,462

(22) Filed: Apr. 30, 2009

Related U.S. Application Data

(63) Continuation of application No. 11/263,539, filed on Oct. 31, 2005, and a continuation of application No. 11/263,555, filed on Oct. 31, 2005, and a continuation of application No. 11/263,554, filed on Oct. 31, 2005, and a continuation of application No. 11/263,540, filed on Oct. 31, 2005, and a continuation of application No. 11/263,656, filed on Oct. 31, 2005, and a continuation of application No. 11/069,593, filed on Feb. 28, 2005.

(51) Int. Cl.
*G01J 1/42* (2006.01)

(52) U.S. Cl. .............. 250/208.2; 359/326; 385/14; 398/126

(58) Field of Classification Search ............. 250/208.2; 359/326; 398/118, 126; 385/14
See application file for complete search history.

(56) References Cited

U.S. PATENT DOCUMENTS

| | | | |
|---|---|---|---|
| 6,020,850 A | 2/2000 | Ji et al. | |
| 6,038,060 A | 3/2000 | Crowley | |
| 6,258,401 B1 | 7/2001 | Crowley | |
| 6,310,583 B1 | 10/2001 | Saunders | |
| 6,700,454 B2 | 3/2004 | Yaniv et al. | |
| 6,700,550 B2 | 3/2004 | Crowley | |
| 6,737,939 B2 | 5/2004 | Hoppe et al. | |
| 6,749,827 B2 | 6/2004 | Smalley et al. | |
| 6,824,755 B2 | 11/2004 | Colbert et al. | |
| 7,010,183 B2 | 3/2006 | Estes et al. | |
| 7,043,129 B2 * | 5/2006 | Auner et al. | ................ 385/130 |
| 7,083,104 B1 | 8/2006 | Empedocles et al. | |
| 7,132,994 B2 | 11/2006 | Crowley | |
| 7,205,021 B2 | 4/2007 | Crowley | |
| 2002/0006489 A1 | 1/2002 | Goth et al. | |

(Continued)

FOREIGN PATENT DOCUMENTS

WO    WO 2006/094081 A2    9/2006

OTHER PUBLICATIONS

Agranovich, V.M.; "Negative refraction in the optical domain and nonlinear wave propagation"; Phys. Usp., 2004, 47 (6); bearing a date of 2004, printed on Dec. 22, 2004; pp. 626-627.

(Continued)

*Primary Examiner*—Georgia Y Epps
*Assistant Examiner*—Kevin Wyatt

(57) ABSTRACT

An optical antenna assembly including multiple optical antenna elements, each of the optical antenna elements are arranged in a regular pattern and carried by a supporting body. The regular pattern of the plurality of optical antenna elements is nonuniform. Certain ones of the optical antenna elements are configured to respond to the one or more waves of light.

14 Claims, 12 Drawing Sheets

U.S. PATENT DOCUMENTS

| | | | |
|---|---|---|---|
| 2003/0122709 | A1 | 7/2003 | Jeon et al. |
| 2005/0179609 | A1* | 8/2005 | Holly .................... 343/793 |
| 2006/0038168 | A1* | 2/2006 | Estes et al. .................. 257/25 |
| 2006/0135110 | A1 | 6/2006 | Przybysz et al. |
| 2006/0237537 | A1 | 10/2006 | Empedocles et al. |
| 2007/0176824 | A1 | 8/2007 | Stumbo et al. |

OTHER PUBLICATIONS

Ahlskog, M.; Tarkiainen, R.; Roschier, L.; Hakonen, P.; "Single-electron transistor made of two crossing multiwalled carbon nanotubes and its noise properties"; Applied Physics Letters; Dec. 11, 2000; vol. 77, No. 24; pp. 4037-4039; located at: http://content.aip.org/APPLAB/v77/i24/4037_1.html; printed on Mar. 2, 2005.

Athley, Fredrik; "Optimization of Element Positions for Direction Finding With Sparse Arrays"; Proceedings of the 11th IEEE Signal ProcessingWorkshop on Statistical Signal Processing; bearing dates of Aug. 6, 2001, Aug. 8, 2001; Singapore; 5 pages. total; located at: http://db.s2.chalmers.se/download/publications/athley_995.pdf; printed on Mar. 2, 2005.

Barnes, W.L.; W.A. Murray; J. Dintinger; E. Devaux; T.W. Ebbesen; "Surface Plasmon Polaritons and Their Role in the Enhanced Transmission of Light through Periodic Arrays of Subwavelength Holes in a Metal Film"; Physical Review Letters; bearing a date of Mar. 12, 2004; pp. 107401-1/107401-4; vol. 92, No. 10; The American Physical Society.

Bozhevolnyi, Sergey I.; Igor I. Smolyaninov; Anatoly V. Zayats; "Near-field microscopy of surface-plasmon polaritons: Localization and internal interface imaging"; Physical Review B; bearing a date of Jun. 15, 1995; pp. 17916-17924, Figures 3,5,7,9,11; vol. 51, No. 24; The American Physical Society.

Cao, Hua; Ajay Nahata; "Resonantly enhanced transmission of terahertz radiation through a periodic array of subwavelength apertures"; Optics Express; bearing a date of Mar. 22, 2004; pp. 1004-1010; vol. 12, No. 6.

Chang,Yian; Fetterman, Harold R., Fellow, IEEE; Newberg, Irwin L., Life Member, IEEE; Panaretos, Steve, K.; "Microwave Phase Conjugation Using Antenna Arrays"; IEEE Transactions on Microwave Theory and Techniques; bearing a date of Nov. 1998; vol. 46, No. 11; pp. 1910-1919; located at: http://www.pacificwaveind.com/html/Autotracking1.pdf; printed on Mar. 2, 2005.

Cumings, John; Zettl, A.; "Field emission and current-voltage properties of boron nitride nanotubes"; Solid State Communications; bearing dates of Jun. 10, 2003; Nov. 14, 2003; Nov. 18, 2003; 2004; vol. 129; pp. 661-664; Elsevier Ltd.; located at: http://physics.berkeley.edu/research/zettl/pdf/292.Science129cumings.pdf; printed on Mar. 2, 2005.

Ditlbacher, H.; J.R. Krenn; G. Schider; A. Leitner; F. R. Aussenegg; "Two-dimensional optics with surface plasmon polaritons"; Applied Physics Letters; bearing a date of Sep. 2, 2002; pp. 1762-1764; vol. 81, No. 10; American Institute of Physics.

Feurer, T.; Vaughan, Joshua C.; Nelson, Keith A.; "Spatiotemporal Coherent Control of Lattice Vibrational Waves"; Science; Jan. 17, 2003; vol. 299; pp. 374-377; located at: www.sciencemag.org; printed on Mar. 2, 2005.

Feurer, T.; Vaughan, Joshua C.; Hornung, T.; Nelson, Keith A.; "Typesetting of terahertz waveforms"; Optics Letters; Aug. 1, 2004; vol. 29, No. 15; pp. 1802-1804; Optical Society of America; printed on Mar. 3, 2005.

Gol'Tsman, G.N.; A.D. Semenov; Y.P. Gousev; M.A. Zorin; I.G. Gogidze; E.M. Gershenzon; P.T. Lang; W.J. Knott; K.F. Renk; "Sensitive picosecond NbN detector for radiation from millimetre wavelengths to visible light"; Supercond. Sci. Technol.; bearing a date of 1991; pp. 453-456; IOP Publishing Ltd.

Guo, Jing; Mark Lundstrom; Supriyo Datta; "Performance projections for ballistic carbon nanotube field-effect transistors"; Applied Physics Letters; bearing a date of Apr. 29, 2002; pp. 3192-3194; American Institute of Physics.

Guo, Jing; Sebastien Goasguen; Mark Lundstrom; Supriyo Datta; "Metal-insulator-semiconductor electrostatics of carbon nanotubes"; Applied Physics Letters; bearing a date of Aug. 19, 2002; pp. 1486-1488; vol. 81, No. 8; American Institute of Physics.

Guo, Jing; Supriyo Datta; Mark Lundstrom; "A Numerical Study of Scaling Issues for Schottky Barrier Carbon Nanotube Transistors"; School of Electrical and Computer Engineering—Purdue University; printed on Dec. 22, 2004; pp. 1-26.

Guo, Jing; Jing Wang; Eric Polizzi; Supriyo Datta; Mark Lundstrom; "Electrostatics of Nanowire Transistors"; School of Electrical and Computer Engineering—Purdue University; printed on Dec. 22, 2004; pp. 1-23.

Hibbins, Alastair P.; J. Roy Sambles; "Squeezing Millimeter Waves into Microns"; Physical Review Letters; bearing a date of Apr. 9, 2004; pp. 143904-1-143904-4; vol. 92, No. 14; The American Physical Society.

Hossein-Zadeh, Mani; Levi, A.F.J.; "Self-homodyne RF-optical microdisk receiver"; CLEO 2004; bearing a date of May 19, 2004; pp. 1-17; Advanced Network Technology Lab: University of Southern California; located at: http://www.usc.edu/dept/engineering/eleceng/Adv_Network_Tech/Html/publications/cleo2004.pdf; printed on Mar. 2, 2005.

Javey, Ali; Jing Guo; Damon B. Farmer; Qian Wang; Dunwei Wang; Roy G. Gordon; Mark Lundstrom; Hongjie Dai; "Carbon Nanotube Field-Effect Transistors with Integrated Ohmic Contacts and High—k Gate Dielectrics"; Nano Letters; bearing a date of February 20, 2004; pp. 447-450; vol. 4, No. 3; American Chemical Society.

Javey, Ali; Jing Guo; Damon B. Farmer; Qian Wang; Erhan Yenilmez; Roy G. Gordon; Mark Lundstrom; Hongjie Dai; "Self-Aligned Ballistic Molecular Transistors and Electrically Parallel Nanotube Arrays"; Nano Letters; bearing a date of June 23, 2004; pp. 1319-1322; vol. 4, No. 7; American Chemical Society.

Javey, Ali; Jing Guo; Qian Wang; Mark Lundstrom; Hongjie Dai; "Ballistic carbon nanotube field-effect transistors"; Nature; bearing a date of August 7, 2003; pp. 654-657; vol. 424; Nature Publishing Group.

Javey, Ali; Jing Guo; Magnus Paulsson; Qian Wang; David Mann; Mark Lundstrom; Hongjie Dai; "High-Field Quasiballistic Transport in Short Carbon Nanotubes"; Physical Review Letters; bearing a date of Mar. 12, 2004; pp. 106804-1-106804-4; vol. 92, No. 10; The American Physical Society.

Knap, W.; Y. Deng; S. Rumyantsev; M.S. Shur; "Resonant detection of subterahertz and terahertz radiation by plasma waves in submicron field-effect transistors"; Applied Physics Letters; bearing a date of Dec. 9, 2002; pp. 4637-4639; vol. 81, No. 24; American Institute of Physics.

Koehl, Richard M.; Nelson, Keith A.; "Coherent optical control over collective vibrations traveling at lightlike speeds"; Journal of Chemical Physics; Jan. 22, 2001; vol. 114, No. 4; pp. 1443-1446; American Institute of Physics; printed on Mar. 3, 2005.

Kottmann, Jorg P.; Olivier J.F. Martin; "Plasmon resonant coupling in metallic nanowires"; Optics Express; bearing a date of Jun. 4, 2001; pp. 655-663; vol. 8, No. 12.

Krenn, Joachim R.; " Nanoparticle Waveguides Watching energy transfer"; News & Views; bearing a date of Apr. 2003; pp. 1-2; vol. 2; Nature Materials.

Lee, J.U.; P.P. Gipp; C.M. Heller; "Carbon nanotube p-n junction diodes"; Applied Physics Letters; bearing a date of Jul. 5, 2004; pp. 145-147; vol. 85, No. 1; American Institute of Physics.

Lee, Ian Y.; Xiaolei Liu; Bart Kosko; Chongwu Zhou; "Nanosignal Processing: Stochastic Resonance in Carbon Nanotubes That Detect Subthreshold Signals"; Nano Letters; bearing a date of Nov. 11, 2003; pp. 1683-1686; vol. 3, No. 12; American Chemical Society.

Li, Shengdong; Zhen Yu; Sheng-Feng Yen; W.C. Tang; Peter J. Burke; "Carbon Nanotube Transistor Operation at 2.6 GHz"; Nano Letters; bearing a date of Mar. 23, 2004; pp. 753-756; vol. 4, No. 4; American Chemical Society.

Lu, Chenguang; Qiang Fu; Shaoming Huang; Jie Liu; "Polymer Electrolyte-Gated Carbon Nanotube Field-Effect Transistor"; Nano Letters; bearing a date of Mar. 12, 2004; pp. 623-627; vol. 4, No. 4; American Chemical Society.

Maestrini, Alain; John Ward; John Gill; Goutam Chattopadhyay; Frank Maiwald; Katherine Ellis; Hamid Javadi; Imran Mehdi; "A Planar-Diode Frequency Tripler at 1.9 THz"; 2003 IEEE Mtt-S Digest; bearing a date of Jan. 2003; pp. 747-750.

Mayorga, I. Camara; M. Mikulics; M. Marso; P. Kordos; a. Malcoci; A. Stoer; D. Jaeger; R. Gusten; "THz Photonic Local Oscillators"; bearing a date of Sep. 2003; Max-Planck-Institute for Radioastronomy.

Nakanishi, Takeshi; Ando, Tsuneya; "Electrical Transport through Crossed Carbon Nanotube Junctions"; Institute for Solid State Physics; Department of Applied Physics and Dimes: Delft University of Technology, the Netherlands; pp. 1-4; located at: http://www.stat.phys.titech.ac.jp/ando/treport/pdf/etccnj4.pdf; printed on Mar. 2, 2005.

"Nano-Optics Publications 1997-2005"; printed on Dec. 22, 2004; pp. 1-7; Nanooptics Publications; located at: http://nanooptics.uni-graz.attol/ol_publi.html.

Ocelic, N.; R. Hillenbrand; "Subwavelength-scale tailoring of surface phonon polaritons by focused ion-beam implantation"; Nature Materials-Letters; bearing a date of Sep. 2004; pp. 606-609; vol. 3; Nature Publishing Group.

PCT International Search Report; International App. No. PCT/US06/07334; pp. 1-3; Apr. 28, 2008.

Pearson, J.C.; I. Mehdi; E. Schlecht; F. Maiwald; A. Maestrini; J. Gill; S. Martin; D. Pukala; J. Ward; J. Kawamura; W.R. McGrath; W.A. Hatch; D. Harding; H.G. Leduc; J.A. Stern; B. Bumble; L. Samoska; T. Gaier; R. Ferber; D. Miller; A. Karpov; J. Zmuidzinas; T. Phillips; N. Erickson; J. Swift; Y.-H. Chung R. Lai; H. Wang; "THz Frequency Receiver Instrumentation for Herschel's Heterodyne Instrument for Far Infrared (HIFI)"; printed on Dec. 22, 2004; located at: http://www.jsward.com/publications/2002-SPIE-Pearson.pdf.

Ruppin, R.; "Surface polaritons and extinction properties of a left-handed material cylinder"; Journal of Physics: Condensed Matter; bearing a date of Aug. 13, 2004; pp. 5991-5998; vol. 16; IOP Publishing Ltd.

Ryzhii, V.; I. Khmyrova; M. Shur; "Terahertz photomixing in quantum well structures using resonant excitation of plasma oscillations"; Journal of Applied Physics; bearing a date of Feb. 15, 2002; pp. 1875-1881; vol. 91, No. 4; American Institute of Physics.

Salerno, M.; J.R. Krenn; B. Lamprecht; G. Schider; H. Ditlbacher; N. Felidj; A. Leitner; F.R. Aussenegg; "Plasmon polaritons in metal nanostructures: the optoelectronic route to nanotechnology"; Opto-Electronics Review; bearing a date of 2002, printed on Dec. 22, 2004; pp. 217-224; vol. 10, No. 3.

Schider, G.; J.R. Krenn; A. Hohenau; H. Ditlbacher; A. Leitner; F.R. Aussenegg; W.L. Schaich; I. Puscasu; B. Monacelli; G. Boreman; "Plasmon dispersion relation of Au and Ag nanowires"; Physical Review B; bearing a date of 2003; pp. 155427-1-155427-4; vol. 68, No. 15; The American Physical Society.

Smolyaninov, Igor I.; Anatoly V. Zayats; Christopher C. Davis; "Near-field second harmonic generation from a rough metal surface"; Physical Review B; bearing a date of Oct. 15, 1997; pp. 9290-9293; vol. 56, No. 15; The American Physical Society.

Stoyanov, Nikolay S.; David W. Ward; Thomas Feurer; Keith A. Nelson; "Terahertz polariton propagation in patterned materials"; Nature Materials-Letters; bearing a date of Oct. 2002; pp. 95-98; vol. 1; Nature Publishing Group.

Takahashi, Satoshi; Anatoly V. Zayats; "Near-field second—harmonic generation at a metal tip apex"; Applied Physics Letters; bearing a date of May 13, 2002; pp. 3479-3481; vol. 80, No. 19; American Institute of Physics.

"Terahertz surface plasmon polaritons"; THz SPP's; printed on Dec. 22, 2004; pp. 1-4; located at: http://www-users.rwth-aachen.de/jaime.gomez/spp.html.

Ward, David W.; Statz, Eric; Beers, Jaime D.; Stoyanov, Nikolay; Feurer, Thomas; Roth, Ryan M.; Osgood, Richard M.; Nelson, Keith A.; "Phonon-Polariton Propagation, Guidance, and Control in Bulk and Patterned Thin Film Ferroelectric Crystals"; Mat. Res. Soc. Symp. Proc.; bearing a date of 2004; vol. 797; pp. W5.9.1-W5.9.6; Materials Research Society; located at: http://web.mit.edu/dwward/www/publications.htm; printed on Mar. 2, 2005.

Ward, John; Eric Schlecht; Goutam Chattopadhyay; Alain Maestrini; John Gill; Frank Maiwald; Hamid Javadi; Imran Mehdi; "Capability of THz sources based on Schottky diode frequency multiplier chains"; 2004 IEEE MTT-S Digest; bearing a date of Jan. 2004; pp. 1587-1590.

Ward, John; Goutam Chattopadhyay; Alain Maestrini; Erich Schlecht; John Gill; Hamid Javadi; David Pukala; Frank Maiwald; Imran Mehdi; "Tunable All-Solid-State Local Oscillators to 1900 GHz"; printed on Dec. 22, 2004; located at: http://www.jsward.com/publications/2004-04-Stt-Ward.pdf.

Ward, John; Frank Maiwald; Goutam Chattopadhyay; Erich Schlecht; Alain Maestrini; John Gill; Imran Mehdi; "1400-1900 GHz Local Oscillators for the Herschel Space Observatory"; printed on Dec. 22, 2004; located at: http://www.jsward.com/publications/2003-04-STT-Ward.pdf.

Yacoubian, Araz; Chuyanov, Vadim; Garner, Sean M.; Steier, William H.; Ren, Albert S.; Dalton, Larry R.; "EO Polymer-Based Integrated-Optical Acoustic Spectrum Analyzer"; IEEE Journal of Selected Topics in Quantum Electronics; bearing dates of Sep. 2000; Oct. 2000 and 2001; vol. 6, No. 5; pp. 810-816; IEEE; printed on Mar. 2, 2005.

Yao, X. Steve; "Phase-to-Amplitude Modulation Conversion Using Brillouin Selective Sideband Amplification"; IEEE Photonics Technology Letters; Feb. 1998; vol. 10, No. 2; pp. 264-266; IEEE; printed on Mar. 3, 2005.

Yao, Zhen; Henk W. CH. Postma; Leon Balents; Cees Dekker; "Carbon nanotube intramolecular junctions"; Letters to Nature; bearing a date of Nov. 18, 1999; pp. 273-276; vol. 402; Macmillan Magazines Ltd.

Yen, T.J.; W.J. Padilla; N. Fang; D.C. Vier; D.R. Smith; J.B. Pendry; D.N. Basov; X. Zhang; "Terahertz Magnetic Response from Artificial Materials"; Reports; bearing a date of Mar. 5, 2004; pp. 1494-1496; vol. 303; Science Magazine.

Zayats, Anatoly; "Surface Plasmon Photonics"; Photonics Seminar @UCC; printed on Dec. 22, 2004; located at: http://phys.ucc.ie/PhotonicsSeminar/Zayats.html.

Zettl, Alex; Mceuen, Paul; "Novel Nanosized Electronic Devices Fabricated: Carbon Nanotubes Used to Construct Transistors and Junctions"; Lawrence Berkeley Laboratory; p. 1 of 1; SP2 Materials Initiative Materials Sciences Division: Berkeley Lab; located at: http://www.lbl.gov/msd/PIs/Zett1/00/00_9_Zettl.pdf; printed on Mar. 2, 2005.

UK Intellectual Property Office Examination Report Under Section 18(3); App. No. GB0717033.5; March 3, 2010 (received by our Agent on March 5, 2010); pp. 1-2.

* cited by examiner

OPTICAL ANTENNA ELEMENTS 102a AND 102b ARE IN PHASE

PHASE OF OPTICAL ANTENNA ELEMENT 102b OUT OF PHASE
WITH OPTICAL ANTENNA ELEMENT 102a

ELECTROMAGNETIC DEVICE WITH INTEGRAL\NON-LINEAR COMPONENT

CROSS-REFERENCE TO RELATED APPLICATIONS

The present application is related to, claims the earliest available effective filing date(s) from (e.g., claims earliest available priority dates for other than provisional patent applications; claims benefits under 35 USC §119(e) for provisional patent applications), and incorporates by reference in its entirety all subject matter of the following listed application(s) (the "Related Applications") to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s) to the extent such subject matter is not inconsistent herewith. The United States Patent Office (USPTO) has published a notice to the effect that the USPTO's computer programs require that patent applicants reference both a serial number and indicate whether an application is a continuation or continuation in part. The present applicant entity has provided below a specific reference to the application(s) from which priority is being claimed as recited by statute. Applicant entity understands that the statute is unambiguous in its specific reference language and does not require either a serial number or any characterization such as "continuation" or "continuation-in-part."Notwithstanding the foregoing, applicant entity understands that the USPTO's computer programs have certain data entry requirements, and hence applicant entity is designating the present application as a continuation in part of its parent applications, but expressly points out that such designations are not to be construed in any way as any type of commentary and/or admission as to whether or not the present application contains any new matter in addition to the matter of its parent application(s).

RELATED APPLICATIONS

1. For purposes of the USPTO extra-statutory requirements, the present application constitutes a continuation of U.S. patent application Ser. No. 11/069,593, entitled OPTICAL ANTENNA ASSEMBLY, naming W. Daniel Hillis, Nathan P. Myhrvold, Clarence T. Tegreene and Lowell L. Wood, Jr., as inventors, filed Feb. 28, 2005.

2. For purposes of the USPTO extra-statutory requirements, the present application constitutes a continuation of U.S. patent application Ser. No. 11/263,555, entitled MULTI WAVELENGTH ELECTROMAGNETIC DEVICE, naming W. Daniel Hillis, Nathan P. Myhrvold, Clarence T. Tegreene and Lowell L. Wood, Jr., as inventors, filed Oct. 31, 2005.

3. For purposes of the USPTO extra-statutory requirements, the present application constitutes a continuation of U.S. patent application Ser. No. 11/263,554, entitled OPTICAL ANTENNA WITH PHASE CONTROL, naming W. Daniel Hillis, Nathan P. Myhrvold, Clarence T. Tegreene and Lowell L. Wood, Jr., as inventors, filed Oct. 31, 2005.

4. For purposes of the USPTO extra-statutory requirements, the present application constitutes a continuation of U.S. patent application Ser. No. 11/263,540, entitled ELECTROMAGNETIC DEVICE WITH FREQUENCY DOWN-CONVERTER, naming W. Daniel Hillis, Nathan P. Myhrvold, Clarence T. Tegreene and Lowell L. Wood, Jr., as inventors, filed Oct. 31, 2005.

5. For purposes of the USPTO extra-statutory requirements, the present application constitutes a continuation of U.S. patent application Ser. No. 11/263,656, entitled OPTICAL ANTENNA WITH OPTICAL REFERENCE, naming W. Daniel Hillis, Nathan P. Myhrvold, Clarence T. Tegreene and Lowell L. Wood, Jr., as inventors, filed Oct. 31, 2005.

6. For purposes of the USPTO extra-statutory requirements, the present application constitutes a continuation of U.S. patent application Ser. No. 11/263,539, entitled ELECTROMAGNETIC DEVICE WITH INTEGRAL NON-LINEAR COMPONENT, naming W. Daniel Hillis, Nathan P. Myhrvold, Clarence T. Tegreene and Lowell L. Wood, Jr., as inventors, filed on Oct. 31, 2005.

TECHNICAL FIELD

The present application relates, in general, to antennas and related components and systems, at or near, optical frequencies.

BRIEF DESCRIPTION OF THE FIGURES

FIG. 5b is a top view of one of the optical antenna elements of the optical antenna assembly that is shown in FIG. 5a;

FIG. 17 is a top view of another embodiment of an optical antenna assembly;

DETAILED DESCRIPTION

Figure 1:
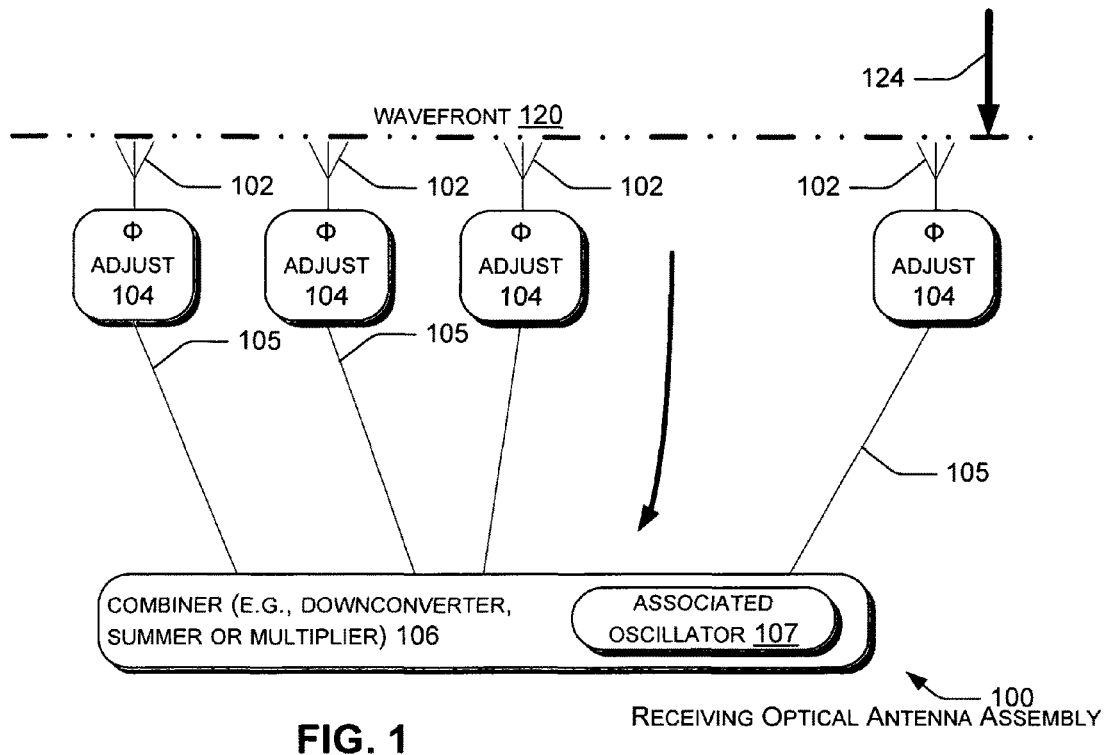
FIG. 1 is a schematic diagram of one embodiment of an optical antenna assembly that is configured to receive optical energy.

This disclosure describes a number of embodiments of one or more optical antenna elements that can be arranged in an optical antenna assembly. The optical antenna assembly may include an array of the optical antenna elements. Such arrays of optical antenna elements may, in certain embodiments, be spatially arranged in either a non-uniform or uniform pattern to provide the desired optical antenna assembly characteristics and/or generate or receive light having a desired response. The configuration of the arrays of optical antenna elements within the optical antenna assembly may affect the shape, strength, operation, and characteristics of the waveform received by, or generated by, the optical antenna assembly.

Optical antenna elements may be configured to either generate or receive light. In actuality, the physical structure of a generating optical antenna element can be identical to that of a receiving optical antenna element. As such, a single optical antenna element, or an array of such elements, can be used to generate and/or receive light. This disclosure thereby includes a description of the structure or the associated characteristics of a number of embodiments of generating and receiving optical antenna assemblies. The receiving optical antenna assembly, as described with respect to FIG. 1, acts to convert received light (of the visible or near-visible spectrum) into an electrical signal. The generating optical antenna element, as described with respect to FIG. 2, converts an electrical signal into corresponding generated light.

Within this disclosure, the term "optical" as applied to the phrase "optical antenna" indicates that the antenna generates or receives energy, or otherwise interacts with energy, at or near optical frequencies. This light and/or energy can be converted to/from electrical signals that can be transported along conductive or similar pathways. The fundamental physics of such optical antenna elements can therefore rely upon the conversion of energy between electromagnetic waves that travel through a medium such as air or a vacuum, and electrical signals that travel along an electrically conductive or similar pathway, and/or vice versa. A number of publications that relate to nanostructures are described in the publication: "NANO-OPTICS Publications 1997-2005"; printed on Dec. 22, 2004; pp. 1-7; Nanooptics Publications; located at: http://nanooptics.uni-graz.at/ol/ol_publi.html.

Applications for optical antenna assemblies include, but are not limited to, cameras, telescopes, beamformers, solar cells, detectors, projectors, and light sources.

In this disclosure, the terms "visible" or "optical" light, or simply "light" also relate in this disclosure to so-called "near-visible" light such as that in the near infrared, infra-red, far infrared and the near and far ultra-violet spectrums. Moreover, many principles herein may be extended to many spectra of electromagnetic radiation where the processing, electronic components, or other factors do not preclude operation at such frequencies, including frequencies that may be outside ranges typically considered to be optical frequencies.

Within this disclosure, the term "regular", when referring to a plurality or array of optical antenna elements, is not limited to substantially evenly spacing between or among various components. Moreover, regular spacing may be satisfied at the points of attachment, or other locations of components, that may not extend in parallel. Further, the dimensions of individual components may be small in many embodiments, and minor deviations from exact placement or separation may still be considered regular. Further, regular may pertain to spacings, features, separations, or other aspects of individual or groups of components.

Similarly, the term "uniform", does not require exact uniformity of size, features, spacing, distribution or other aspects that may be considered to be uniform. Altering a configuration of optical antenna elements by reducing the probability of optical antenna elements forming thereat, forming shorter optical antenna elements in a particular region, removing optical antenna elements from a particular region, etc. can have the effect of altering the optical characteristics of the of the optical antenna assembly.

To efficiently generate or receive light, the effective lengths of the optical antenna elements usually equal some integer multiple of quarter wavelengths of the generated or received light ($\lambda/4$). The physical length dimension of single wavelength versions of the optical antenna elements can approximately equal the effective wavelength of the generated or received light. Due to the minute wavelength of many of the relevant ranges of light, many embodiments of the optical antenna elements can be fabricated to be minute (e.g. such as within the micro- or nano-scale), and still allowing the antenna elements to couple with the electromagnetic radiation that occurs at similar light wavelengths such as within the visible spectrum.

In some cases, optical antenna assemblies (including both those that are configured to receive light and/or generate light) can be designed to provide a variety of efficiencies based largely on coherency of light produced by multiple included optical antenna elements and their coherencies. Light from multiple coherently generating or receiving optical antenna elements may be in phase at a number of locations or at various angular ranges. In such configurations, their wave amplitude may add or interfere coherently at one or more locations or angles relative to the array of optical antenna element. In other applications, it may be desirable to configure an optical antenna assembly to generate light that is out of phase at one or more spatial locations or angular ranges relative to the optical antenna assembly, and therefore generate or receive substantially incoherent light or partially coherent light at some or all spatial locations or angular ranges relative to the array.

The relationship between two adjacent optical antenna elements such as exists in an antenna array is described herein to indicate how the light from arrays of optical antenna elements constructively or destructively interfere. This constructive and destructive interference is often relevant to such optical antenna assembly issues as wave phases, beamforming, and beamsteering as described in this disclosure. The relationship between the two adjacent optical antenna elements can be extended in principle to either uniform or non-uniform arrays depending upon the desired waveform. Moreover, while such principles can be relevant to the operation, understanding, and/or characteristics of many embodiments, a variety of other design principles may be employed in such designs or analyses.

Light that is generated or received from pairs of proximally-located generating optical antenna elements or proximally-located receiving optical antenna elements can destructively interfere at a number of locations relative to the optical antenna elements, and light can constructively interfere at other spatial locations. As such, the respective generating or receiving optical antenna elements can generate or receive light from one or more spatial locations or angular ranges. The relative phase relationships of the light that is generated or received by the optical antenna element largely dictates those spatial locations, relative to the array, where the combined optical signal is mostly in phase and therefore the amplitude of the combined signals from the array of optical antenna elements contribute to be of the greatest intensity at each point along that region of the waveform. Destructive interference between proximate pairs of optical antenna elements can produce a reduced amplitude or gain in corresponding regions.

Adjusting the relative phases of the generating or receiving optical antenna elements can control gain along respective paths relative to the optical antenna assembly at which the light is generated or received. In some applications the phases may be controlled to produce a relatively high gain along a limited range of directions. In an emissive case, this process may be referred to as "beamforming". An associated process involves changing the direction of gain. This process may be referred to as "beam steering". Many embodiments of the optical antenna assembly can be phased array optical devices that utilize beamforming and/or beamsteering techniques.

Figure 2:
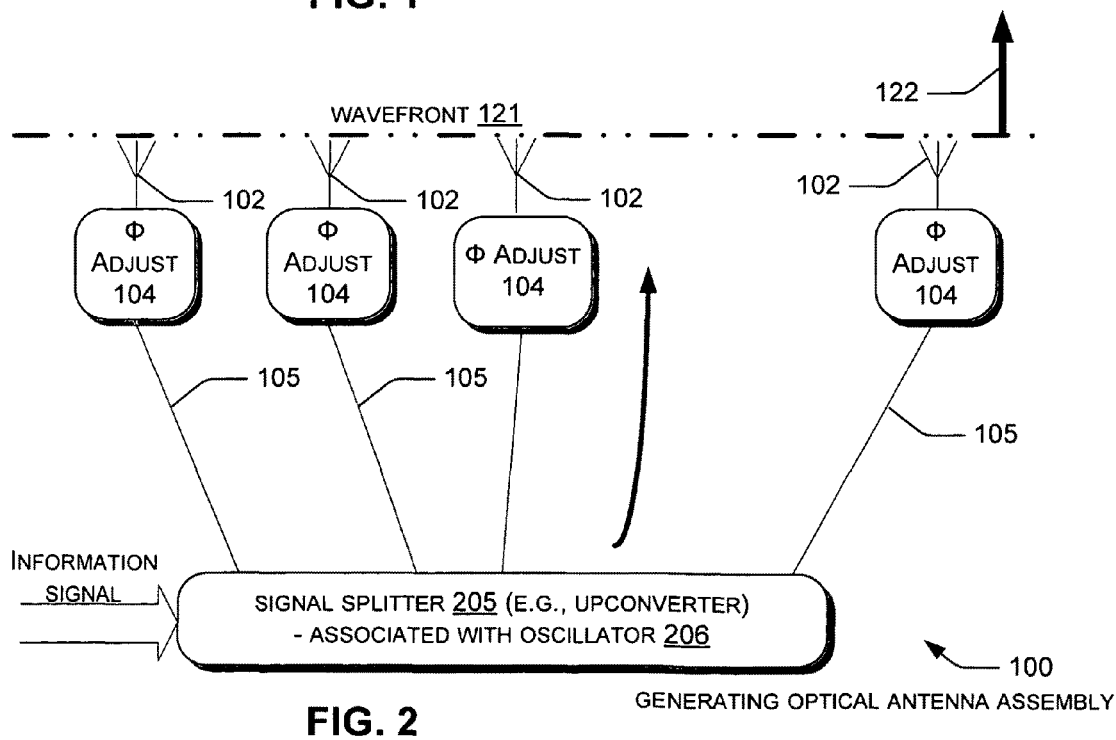
FIG. 2 is a schematic diagram of another embodiment of an optical antenna assembly that is configured to emit light.

In many embodiments, an optical antenna assembly 100 as described with respect to both FIGS. 1 and 2, includes a number of the optical antenna elements 102 that can be arranged in a substantially planar array to form the optical antenna assembly 100, though the structures methods and systems described herein are not limited to embodiments having planar or substantially planar arrangements. The arrangement of optical antenna elements 102 can be either regular or non-regular and can be two-dimensional, or three-dimensional. In one approach, a three dimensional arrangement may be achieved by stacking two or more two-dimensional arrays. The arrangements of antenna elements and the configuration of individual optical antenna elements may be varied according to the principles described herein to produce a variety of frequency responses, beam patterns, or other operational properties.

Examples of Receiving Optical Antenna Assemblies

This portion of the disclosure describes a number of embodiments of a receiving optical antenna assembly as described with respect to FIG. 1. A subsequent portion of the disclosure describes a number of embodiments of a generating optical antenna assembly, as described with respect to FIG. 2. Several embodiments of optical antenna assemblies, including embodiments according to FIGS. 1 and 2, can be arranged in either a receiving or generating configuration, as described with respect to FIG. 1, 2, 3, 4, 5a, or 5b. The relevance of having the arrays of optical antenna elements uniformly or non-uniformly spaced within the optical antenna assemblies is described in this disclosure. Certain embodiments of the detector and light source configurations, by which light transitions to, or is transitioned from, electrical signals are also described herein.

The optical antenna assembly 100 that is configured as a receiver can be applied to a number of different applications including, but not limited to, a light detector, a light sensor, a camera, etc. The optical antenna assembly 100 that is configured as a receiver includes a plurality of optical antenna elements 102 that can be each individually coupled to a respective phase adjust ("φ-adjust") 104 via a respective guiding structure, represented as an individual electrical conductor 105. Electrical signals can transit along the guiding structure from the φ-adjust 104 to a combiner 106.

One skilled in the art will recognize that a variety of approaches to guiding structures may be appropriate to carry signals to or from the antenna elements 102. One example of a nanoparticle waveguide is described in the article J. R. Krenn; "Nanoparticle Waveguides Watching Energy Transfer"; News & Views; April 2003; pp. 1-2; Volume 2; Nature Materials, incorporated herein by reference. An example of a technique to "squeeze" millimeter waves into a micron waveguide is described in the article: A. P. Hibbins, J. R. Sambles; "Squeezing Millimeter Waves into Microns"; Physical Review Letters; Apr. 9, 2004; pp. 143904-1/143904-4; Volume 92, Number 14; The American Physical Society, incorporated herein by reference. Additional references described and incorporated hereinbelow analyze and characterize the propagation of energy along various guiding structures, such as conductors, at higher frequencies, including those at or near optical frequencies and those relating to propagation of plasmons along guiding structures. Some such pathways may include conductors, may be formed from semiconductive or dielectric materials, or may include a combination thereof. Moreover, materials that may be characterized as dielectrics or conductors at one frequency may operate very differently at other frequencies. The actual material that carries or guides electrical signals or waves will depend upon a variety of factors, including the frequency of the energy propagating. Nevertheless, for clarity of the presentation for the current portion of this description, the various guiding structures are represented diagrammatically and referred to herein as the electrical conductor 105, though the term conductor should not be considered to be limited to materials typically considered to be electrical conductors at relatively low frequencies.

The φ-adjust 104 for each light-receiving optical antenna element 102 is capable of adjusting the relative phase of the electrical signal relative to light that is received as a signal formed by each particular optical antenna element 102 at the combiner 106. The φ-adjusts 104 are presented diagrammatically in FIGS. 1 and 2 for clarity of presentation. One skilled in the art will recognize that a variety of structures may be implement the φ-adjust 104 functionality, including, in a relatively straightforward implementation, waveguides having materials with fixed or electrically controllable effective dielectric constants and/or optical transmission distances. Other various exemplary embodiments of the φ-adjust 104 will be described in more detail hereinbelow.

In one approach, the φ-adjust 104 controls the effective time required for a signal to travel from the particular optical antenna element 102 to the combiner 106, and therefore the relative phase of a signal carried by the electrical conductor 105. By adjusting the relative phase of signal traveling through each of the multiple φ-adjusts 104, the relative phases of the signals that can be applied from the optical antenna elements 102 to the combiner can be adjusted.

In one embodiment, signals output from each φ-adjust 104 arrive at the combiner 106 for each receiving optical antenna assembly 100. One φ-adjust 104 is associated with each light-receiving optical antenna element 102, and the φ-adjust 104 is configured to adjust the relative phase of light being produced or received by functioning as a fixed or variable delay element. It is thereby envisioned that in one embodiment, each φ-adjust 104 can be configured as a signal-delay component that delays the duration required for a signal to pass through the φ-adjust 104 by some percentage of a wavelength of the light that is to be received or generated by other corresponding optical antenna elements 102, thereby alternating the relative phases of the signals produced by the different optical antenna elements.

The embodiments of the receiving optical antenna assembly 100 as described with respect to FIG. 1 include the combiner 106 that mixes or otherwise combines signals from the different optical antenna elements to provide an output signal (not shown) corresponding to the amount of light energy received at the respective optical wavelength of each optical antenna element 102.

While the combiner 106 is presented diagrammatically as an operational block coupled to the φ-adjusts 104, one skilled in the art will recognize that a variety of configurations may achieve the functionality realized by the combiner. Some such configurations may even employ free-space optical or RF (radio frequency) techniques to produce a signal that is a function of the signals from the φ-adjusts 104. In some configurations, the signal may be a combination of the signals from the φ-adjusts 104 or may be a nonlinear, square law or other function of such signals, such as a down converted, square law combination, phase or frequency modulated version, or even an integrated sum of such signals.

In some embodiments, the combiner 106 can be configured to include an adder circuit, a multiplier circuit, a mixer circuit, or some other arithmetic configuration depending upon the functionality of the optical antenna assembly 100. The combiner can also include a signal amplifier that amplifies the signal strength that is applied to the combiner 106 to a level (e.g., for certain prescribed frequencies) that is sufficient to transmit the signal to another device, or to an image processor that may identify information represented by the various signals. In many embodiments, the combiner 106 can be associated with, or integrated into, a computer device such as a signal processing portion of an analog or digital computer. As such, the computer device functions as a signal processor to analyze, evaluate, store, or otherwise process signals corresponding to the light received from the different optical antenna elements 102.

In different embodiments, a computer device can be integrated with the combiner 106, and in certain embodiments the computer device can be configured as a full-sized general purpose computer such as a personal computer (PC), a laptop, or a networked computing device. In alternate embodiments, the computer device that is included as portion of the combiner 106 can be configured as a microprocessor, a microcomputer, an application-specific integrated circuit (ASIC), a devoted analog or digital circuit, or other such device. The computer device can therefore be configured as a general-purpose computer, a special-purpose computer, or any other type of computer that is configured to deal with the specific task at hand. In certain embodiments, the combiner 106 includes a multiplexer and/or a downconverter that combines one or more aspects of signals from a plurality of optical antenna elements 102 or a plurality of sets of optical antenna elements 102. While the combiner 106 downconverter is presented diagrammatically herein, a number of structures or materials can operate as combiners, multiplexers, or downconverters, typically through a nonlinear or linear mixing of signals.

Examples of signal downconverters that operate at or near optical frequencies are described by: J. Ward, E. Schlecht, G. Chattopadhhyay, A. Maestrini, J. Gill, F. Maiwald, H. Javadi, and I. Mehdi; "Capability of THz sources based on Schottky diode frequency multiplier chains"; 2004 IEEE MTT-S Digest; January, 2004; pp. 1587-1590 J. Ward, G. Chattopadhyay, A. Maestrini, E. Schlecht; J. Gill, H. Javadi, D. Pukala; F. Maiwald; I. Mehdi; "Tunable All-Solid-State Local Oscillators to 1900 GHz"; Dec. 22, 2004, each of which is incorporated herein by reference.

The one or more aspects of the signals can be characterized by a plurality of frequency ranges, a plurality of time samples, or a plurality of other separable or distinguishable features for the signals that originate from pluralities of optical antenna elements into a single signal that can be transmitted to a remote location for processing, or alternatively the processing can be performed in situ. The output from the combiner 106 can be transferred to a remote location, such as would occur if the optical antenna assembly 100 is configured as part of a network. In certain embodiments of the optical antenna assembly, a variety of components can be operably coupled downstream or upstream of the combiner 106 to assist in the handling or transmission of data signals produced by the combiner.

Another embodiment of a downconverter includes an optical down-converter that, like other forms of downconverters, decreases the frequency of signals. One example of an optical downconverter is an optical device that mixes the signal to be downconverted with a second optical signal, as may be generated by an associated oscillator 107. Mixing of optical signals to produce a lower frequency indicator of information carried by one or more signals is known. An example of such mixing in polymer based materials is described in Yacoubian, et al, *E-O Polymer Based Integrated Optical Acoustic Spectrum Analyzer*, IEEE Journal of Selected Topics in Quantum Electronics, Vol. 6, No. 5 September/October 2000.

Other examples of optical downconversion using heterodyning or homodyning are described by Yao in *Phase-to-Amplitude Modulation Conversion Using Brillouin Selective Side Band Amplification*, IEEE Photonics Technology Letters, Vol. 10. No. 2, February 1998; Hossein-Zadeh and Levi, Presentation at CLEO 2004, May 19, 2004, entitled *Self-Homodyne RF-Optical Microdisk Receiver*, each of which is incorporated herein by reference. Other approaches to downconversion and/or detection are described later in this description.

While the downconverter is shown as incorporated into the combiner, the down-converter may be interposed between the optical antenna elements 102 and the φ-adjusts 104, may be interposed between the φ-adjusts 104 and the combiner 106, or may itself include the φ-adjusts 104. In certain embodiments, the down-converter can be operably coupled to the combiner, wherein the frequency of the electromagnetic radiation that is applied to the combiner 106 is reduced to a level that can be propagated along electrical conductor. In other embodiments, it is envisioned that a mixer may be applied downstream of the combiner 106.

Returning to a general description of the embodiment illustrated in FIG. 1, a wavefront 120 indicates a generally planar orientation of light waves arriving at, and/or received by, the respective receiving optical antenna assembly 100. While the incoming wave in this description is presented as planar for clarity of presentation, the embodiments herein may be configured for operation with a variety of input wave formats, including non-coherent waves and non-planar waves. Moreover, in the disclosure, the term "planar" as applied to waveforms is not limited to the strictest definitions of planar and may include any substantially planar surface, including those that do not have infinite radii of curvature or those that may, for example, have slight surface irregularities. For the receiving optical antenna assembly 100, the wavefront 120 is illustrated as moving in a downward direction as indicated by the arrow 124.

The receiving optical antenna assembly 100 converts the light energy of the wavefront 120 to electrical energy that travels along an electrically conductive path or other signal transmissive path. The receiving optical antenna assembly 100 can thereby be considered as an optical transducer that converts received light energy into a different form.

By adjusting the relative delays of the different optical antenna elements using the φ-adjusts 104, the sensitivity, directionality, gain, or other aspects of the optical antenna assembly 100 can be controllably varied. In certain generating embodiments, this can provide a beamforming and/or beamsteering function.

In one approach, the φ-adjusts 104 may also be configured to selectively block or diminish signals from their respective optical antenna element, as will be described below. Therefore, in certain embodiments, the φ-adjusts 104 can functionally alter the light-generating or light-receiving effects of a particular optical antenna element 102. Removing (or decoupling) certain optical antenna elements from certain arrays of optical antenna elements can make an otherwise regularly-spaced array more non-regularly spaced or more sparse. Alternatively, removing selected elements can functionally control the gain of the optical antenna assembly along selected paths, vary the width of the center lobe and/or the side lobes, or alter some other characteristics that may be dependent upon frequency. Design considerations relating to the number, position, spacing, and other aspects of the optical antenna elements will be described hereinbelow.

In many embodiments of the receiving optical antenna assembly 100 as described with respect to FIG. 1, each of the optical antenna elements 102 can be configured to receive signals that vary in amplitude or phase at different spatial directions across the array. Examples include, but are not limited to, a telescope, a camera, an image detector, a receiving portion of a facsimile machine, a communications receiver, an image copier, or the like.

Other embodiments of the receiving optical antenna assembly can be arranged to receive a substantially uniform image across the entire face of the display. Examples of these embodiments include, but are not limited to, motion detectors, presence detectors, time of day detectors, timing detectors associated with sports events, or the like. The particular configuration of the various components, such as the combiner, can be designed to take into account the type of waveform images that can be received by the optical antenna assembly 100, as well as the uniformity of the waveform image.

It is envisioned that any configuration of such optical antenna assemblies that produces an electrical signal responsive to received light, as claimed by the claims herein, may be within the intended scope of the receiving optical antenna assembly.

Examples of Signal Generating Optical Antenna Elements

FIG. 2 shows a schematic diagram of one embodiment of a generating optical antenna assembly 100 that is configured to emit either coherent light energy or incoherent light energy. Many of the components and techniques that are described in this disclosure with respect to receiving optical antenna assemblies also apply to the generating optical antenna assemblies, and vice versa. Different embodiments of the generating optical antenna assembly 100 can be used in a variety of applications that include, but are not limited to a light source, a display, and/or a variety of other applications that involve directing light toward spatial-locations relative to that array.

In this disclosure, the receiving and generating embodiments of the optical antenna assembly 100 can be provided with many identical reference characters since many of the components of both configurations may be identical or similar, and in some cases, both configurations may actually be used interchangeably. However, certain components of the generating optical antenna assembly may be configured differently for the remaining optical antenna assembly (e.g., such as having differing circuitry and/or different biasing) to provide for different operational characteristics.

While one embodiment of the optical antenna assembly 100 may be configured to generate coherent radiation at certain locations similarly to laser or holographic devices, other embodiments of the optical antenna assembly may produce incoherent light. Such a light source could be steerable and controllable to produce coherent or incoherent light at different times and or different spatial locations or along selected paths. In certain embodiments of the optical antenna assembly 100, the plurality of optical antenna elements 102 included within the generating optical antenna assembly 100 can be arranged in an array. In other embodiments, the optical antenna assembly 100 may include one, or a number of, discrete optical antenna elements 102. Each optical antenna element 102 can be individually attached or operably coupled via a distinct φ-adjust 104.

The embodiment of the generating optical antenna assembly 100, as described with respect to FIG. 2, includes the one or more optical antenna elements 102, corresponding φ-adjusts 104, the electrical conductors 105, and signal splitter 205. The signal splitter 205 diagrammatically represents a component or set of components that distribute signals among the various optical antenna elements 102. However, one skilled in the art will recognize that the signal splitter 205 may actually include functions such as signal combining in some embodiments. For example, as described for some embodiments herein, and as represented in FIG. 2, the signal splitter 205 may combine selected signals with signals from an associated oscillator 206.

In one embodiment, the signal splitter 205 outputs an electrical signal that is a combination of an information signal and the signal from the oscillator 206. The output signal travels along the electrical conductor 105 to the φ-adjust 104. The φ-adjust 104 produces a phase adjusted version of the signal to drive the respective optical antenna element 102. The output of the optical antenna element 102 thus corresponds to the information signal and the oscillator signal.

Depending upon the embodiment of the generating optical antenna assembly 100, a varying, or consistent, level of illumination can be created across all of the optical antenna elements 102 within the optical antenna assembly 100. For example, if the optical antenna assembly 100 is configured as a light source, then each of the optical antenna elements 102 may generate relatively broadband light at its respective spatial location. In other light source approaches the optical antenna elements 102 may be matched to selectively produce light in one or more narrow bands or one or more substantially discrete frequencies. Where the light is in one or more narrow bands, the optical antenna elements 102 may be sufficiently matched to generate coherent light energy.

In certain display device embodiments, it may be desirable to provide a varying light configuration across the optical antenna assembly 100 to display an image by varying the amplitude and/or phase of light from respective ones or sets of optical antenna elements 102.

If the optical antenna assembly 100 is configured as an optical display, then the intensity of the signal from each of the optical antenna elements 102 may be controlled on an individual element basis or according to groupings of elements to provide controllable illumination at respective spatial locations. Where the pattern of the illumination matches a selected image, the emitted light energy may produce a viewable display. In some approaches, the optical antenna elements 102 may be configured to emit light at one or more visible wavelengths so that viewable image may be directly viewable or viewable on an image surface, such as a screen or diffuser. In other approaches, the emitted light may be at frequencies not directly viewable by humans and converted to visible light through wavelength conversion. In one simple approach to wavelength conversion, the emitted light strikes a phosphor, which may be upconverting or downconverting depending upon the configuration, and the phosphor emits visible light with an energy level corresponding to the to level of the emitted non-visible light.

Where the light emitted by the optical antenna elements 102 is coherent, the gain may be controlled as described herein to directionally control beam gain, to produce a scanning beam display.

As described with respect to the FIG. 1 receiving configuration of the optical antenna assembly, the φ-adjusts 104 effectively adjust the relative transit time for a signal (in either direction) between the respective optical antenna element 102 and the corresponding signal splitter 205. In the generating configuration of the optical antenna assembly 100, the φ-adjust 104 can thereby alter the relative phase of the light that is generated by the respective generating optical antenna elements. Such phase control may allow the generating optical antenna assembly 100 to act as a beamsteerer and/or beamformer to control the directionality or angular gain relative to the array of optical antenna elements 102.

In the embodiment of the optical antenna assembly 100 as described with respect to FIG. 2, the oscillator 206 generates an electrical or optical signal that can be supplied to the respective optical antenna element 102. If the signal that is generated from the oscillator 206 is an electrical signal, the signal may directly drive the optical antenna element 102 or the frequency may be lower than that to be emitted by the optical antenna element 102. In such configurations, an up-converter, as will be described below, can convert the frequency of the electrical signal into the frequency of the light from each optical antenna element. Signals output from each oscillator 206 can therefore be applied to one or more respective φ-adjusts 104 that are associated with each generating optical antenna assembly 100. Each φ-adjust 104 may then adjust the relative phase of the light to be generated by each respective optical antenna element 102. As such, each φ-adjust 104 acts as a variable delay element for signals applied to the optical antenna element 102.

The signal splitter 205 is shown in FIG. 2 as being associated with the oscillator 206. Some embodiments of the optical antenna assembly 100 use an oscillator 206 to generate a signal, that may be sinusoidal, of a particular frequency that may then form a reference or carrier signal. The oscillator 206 can be configured in a number of different embodiments, as described below with respect to FIGS. 11, 12, and 13. It is emphasized that the different embodiments of the oscillator as described in this disclosure are illustrative in nature, and are not intended to be limiting in scope. As such, other embodiments of oscillators can be considered to be within the intended scope of the present disclosure.

In certain light-generating embodiments such as a light source, a single oscillator 206 can generate a signal, which may be sinusoidal, that can be applied to individual, multiple, or all of the optical antenna elements 102 within the optical antenna assembly 100. In alternate embodiments such as a display, each of the array of display picture elements (pixels) may be defined by one or more optical antenna elements 102, such that each of (or each group of) the optical antenna elements 102 is associated with a distinct oscillator 206. If substantially uniform levels of illumination are to be provided across multiple optical antenna elements, then fewer oscillators 206 that each supply a consistent signal to multiple optical antenna elements may be used.

In those embodiments of the generating optical antenna assembly 100 that distribute a substantially uniform levels of light across an entire array (such as where the generating optical antenna assembly 100 is used as a light source), the signal splitter 205 can be configured with one oscillator circuit which applies, an identical input signal to each of the generating optical antenna elements 102.

As noted previously, in some approaches the signal splitter 205 is functionally configured to split an input signal, such as the information signal into two or more output signals that may be identical. Each of the output signals drive a respective generating optical antenna element 102 or may form a carrier signal that may be combined with another signal (such as a signal from the oscillator 206) to drive the respective optical antenna element 102.

Such an embodiment may still employ φ-adjusts 104. In one approach, each φ-adjust 104 adjusts the time for the oscillator's signal to reach the corresponding optical antenna element 102, and therefore the relative phase of that optical antenna element. The φ-adjusts 104 in the generating configuration of their respective optical antenna elements 102 and thereby alter the phase of the light generated across the array of elements within the optical antenna assembly 100. Such phase control can employ known techniques to control the effective direction of emitted energy for localized or directional illumination.

Certain embodiments of the generating optical antenna assembly 100 may include an up-converter that is associated with the signal splitter 205. The up-converter acts to transition light to the frequency of a received electrical signal, such as may be modulated according to information content into a signal at optical frequencies. Such an up-converter is typically a non-linear, square law or similar device that produces an output that is a function of the information bearing signal and a second signal, such as may be provided by the oscillator 206. An example of a non-active form of up-converter can be found in T. J. Yen, W. J. Padilla, N. Fang, D. C. Vier, D. R. Smith, J. B. Pendry, D. N. Basov, X. Zhang; "*Terahertz Magnetic Response from Artificial Materials*"; Science Magazine Reports; Mar. 5, 2004; pp. 1494-1496; Volume 303; which is incorporated herein by reference.

Other embodiments of the generating optical antenna assembly 100 include an oscillator that generates signals at optical frequencies directly, thereby bypassing the need for a separate up-converter.

It is also envisioned in certain embodiments that a mixer circuit, multiplier, nonlinear circuit, or other suitable frequency conversion configuration, can up-convert or down-convert the frequency of the electrical signal that is to be transmitted or received by the signal combiner 205 from optical frequencies to frequencies that may be handled more easily by conventional circuitry. An example of a device that generates harmonics of an input signal is described in the article: S. Takahashi, A. V. Zayats; "*Near-field second-harmonic generation at a metal tip apex*"; Applied Physics Letters; May 13, 2002; pp. 3479-3481; Volume 80, Number 19; American Institute of Physics, incorporated herein by reference.

It is envisioned that any configuration of optical antenna assembly that generates light in response to a received electrical signal, as claimed by the claims, may be within the intended scope of the generating optical antenna assembly.

Examples of Optical Antenna Assembly Fabrication Techniques

Many embodiments of the optical antenna elements 102 can be minute (in the micro- or nano-scale), since they can have similar physical dimensions to integer multiples or divisors of the wavelength, $\lambda$, of the light with which the optical antenna elements couple (e.g., $\lambda$, $\lambda/2$, or $\lambda/4$). As such, each receiving or generating optical antenna element 102, as described with respect to the respective FIG. 1 or 2, is configured to respectively receive light or generate light within the visible as well is near-visible light spectrum. Typically, visible wavelengths are on the order of 400-700 nm. In many cases, near visible wavelengths can be considered to be from about 300 nm up to about 1,900 nm. However, other optical ranges may be applicable. For example, the principles and structures described herein may be extended in some cases to substantially shorter wavelengths, such as those of known photolithographic techniques. Such wavelengths can be currently on the order of a few tens of nanometers, e.g., 40 nm, although future production techniques can be expected to reduce these to the single nanometer ranges, or even smaller. The principles herein should be adaptable to such dimensions, taking nanoscale effects into account. Similarly, the upper wavelength (lower frequency) limits are not necessarily limited to visible or near visible wavelengths. In fact, the principles, structures, and methods herein may be applicable at wavelengths in the near infrared (e.g., about 700-5000 nm), mid-infrared (e.g., about 5000 nm-25 micron), or far infrared (e.g., about 25-350 micron ranges). One skilled in the art will recognize that these ranges are approximate. For example, the upper end of the mid-infrared range is sometimes defined as about 30 or 40 microns and the upper end of the far infrared is sometimes defined as about 250 microns.

A quarter-wave optical antenna element 102 has an effective length substantially equal to one-quarter the wavelength of the received/generated light for the corresponding medium. A half-wave optical antenna element 102 has an effective length substantially equal to one-half the wavelength of the received/generated light, for the corresponding medium. One skilled in the art will recognize that the wavelength depends upon the configuration and associated media, including the effective dielectric constant of the media through which the signals propagate.

The individual optical antenna elements 102 can be arranged in arrays to form the optical antenna assemblies, and hence the optical antenna elements may be fabricated within the nano- or micro-scale. It is therefore envisioned that many optical antenna assembly applications will involve a large number of the optical antenna elements that can be arranged in an array. As such, one fabrication approach employs semiconductor processing techniques to produce a number of elements having well controlled positioning and/or dimensions.

Such fabrication approaches may be selected in cases where there are little operation and configuration variations between the individual optical antenna elements, though other systems may also employ such techniques.

Appropriate semiconductor processing techniques include, but are not limited to, lithography (such as photo-lithography, e-beam lithography), nanotube growth, self assembly, or fabrication of other nano structures. Other known techniques that can be used to produce large arrays of optical antenna elements can be within the intended scope of the present disclosure.

The different embodiments of the optical antenna assembly 100 can therefore be considered as an optical antenna that "captures" or "generates" light energy, as described respectively with respect to FIGS. 1 and 2. As may be noted from the above description, phase control of the individual optical antenna elements may allow the gain of the optical antenna assembly to be defined independently of conventional optical focusing or processing techniques, such as with lenses, or of diffractive, refractive, or reflective elements, including left handed materials. However, the principles, structures, and methods described herein do not necessarily exclude use with more conventional optical focusing, shaping, processing or other techniques, such as lenses, diffractive elements, phase plates, filters, apertures, polarizers, or other more conventional components or systems.

Typical analysis of photon emitters or receivers traditionally has been considered under the domain of quantum physics, as often characterized by Schroedinger's equations. While such analysis may be applicable to many aspects of the devices and systems described herein, the design and characteristics of the optical antenna assembly 100 will typically involve more Maxwellian analysis and design. As such, many of the antenna techniques and equations that apply to antenna design, wave propagation, coupling, and other aspects of the microwave, and other, electromagnetic radiation spectra may be applied relatively directly to the designs and systems described herein. For example, optical antenna assembly designs, concepts and analysis may use phased-array techniques for synthetic apertures or other antenna-related concepts to detect, generate, direct, or otherwise interact with energy at optical frequencies.

Figure 3:
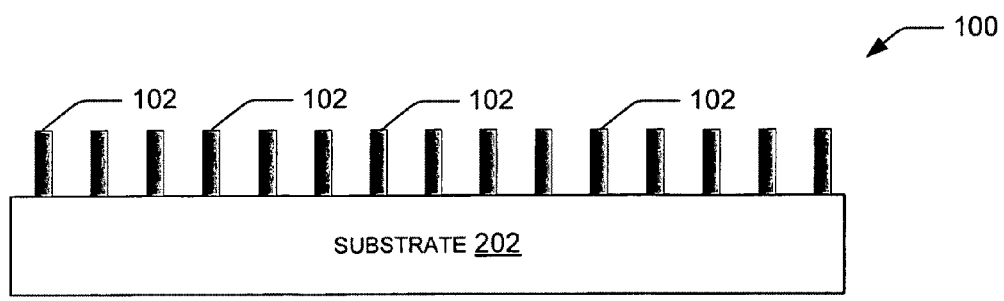
FIG. 3 is a generalized cross sectional diagram of a portion of one embodiment of an optical antenna assembly.

FIG. 3 shows diagrammatically a side view of one generalized embodiment of the optical antenna assembly 100 as described with respect to FIGS. 1 and/or 2. The optical antenna assembly 100 can be fabricated using a variety of semiconductor processing techniques or other suitable techniques. In certain embodiments, the substrate 202 or supporting body carries such elements as the φ-adjust 104, the combiner 106, the signal splitter 205, or the oscillator 206 as described in either FIG. 1 or FIG. 2, though these are omitted from FIG. 3 for directness of presentation. In this disclosure, the term "carries" in the physical, rather than signal carrying, context may apply to a component, such as the optical antenna element, being individually attached or operably coupled to the substrate 202, integrated into or contained within the substrate, operably coupled to some intermediate structure that attaches the optical antenna element to the substrate, or any other type of arrangement where the substrate can be said to carry or support. Additionally, in certain embodiments, the substrate 202 can be configured considerably differently than conventional semiconductor substrates. For example, materials such as polymers, metals, rubber, glasses, or minerals can form the substrate that carries the optical antenna elements. Additionally, in certain embodiments, some type of field can be established to maintain the optical antenna element in position with respect to each other in addition to or independent of physical structural support.

The substrate may also include additional components in some configurations, such as up-converters, down-converters, mixers, and/or de-mixers that are described with respect to certain of the figures). A row of optical antenna elements 102 may be positioned behind or beside each optical antenna element 102 shown in FIG. 3, thereby creating a two-dimensional array of optical antenna elements 102.

Where the elements 102 can be positioned in a relatively stacked arrangement, multiple substrates, or one or more layers formed on substrates that each contain a two-dimensional array of optical antenna elements can be positioned in fixed or variable positions relative to each other. In some cases, the two dimensional arrangements can be accomplished by variable spacing between the rows of optical antenna elements 102 or other non-uniform arrangements. Such two dimensional arrangements may be stacked, deposited, formed or otherwise assembled or fabricated with a stacked, layered, or other three dimensional arrangement to form a three-dimensional array of optical antenna elements. Such three-dimensional arrays can be used for a variety of purposes, for example as a group of cooperating optical antenna elements.

In other applications, one or more of the layers of optical antenna elements may operate as a reference waveform generator. The reference wave may provide a driving signal for down converting or mixing, may operate as a relative phase control, or may provide a reference wave against which incoming or outgoing waves can be compared. In one approach, the energy of the reference wave may be applied simultaneously with that of an incoming wave to produce an electrical signal that corresponds to a linear or nonlinear combination of the incoming and reference waves. In one relatively straightforward approach, the electrical signal corresponds to the sum of the amplitudes of the reference wave and the incoming wave. If the two waves are at substantially the same frequency, the sum may be a coherent sum and provide relative phase information.

A variety of arrays of non-regular or regular optical antenna element configurations can be described with respect to this disclosure. In one embodiment, spacing between each row and/or column of optical antenna elements 102 is relatively uniform to produce regular arrays of optical antenna elements 102. Alternatively, each one of the optical antenna elements may be irregularly spaced to produce relatively non-uniform arrays of optical antenna elements. A variety of regular or irregular arrays of optical antenna elements can be selected depending upon the desired antenna gain and beam pattern. Where the relative phases of incoming or outgoing waves can be determined or controlled, the gain or directionality of the optical antenna assembly can be controlled using beamforming and beamsteering concepts. The design, material, or the configuration of the optical antenna elements may be selected based upon the particular design or application of the array of the optical antenna element.

In one embodiment, lithographical approaches can produce a large number of different embodiments of arrays of optical antenna elements 102, or discrete optical antenna elements. The complexity of each optical antenna element ranges from relatively simple dipole optical antenna element configurations, including for example, nanotubes or conductive or dielectric pillars, to those including bends, curves, discontinuities, or other irregular configurations. Lithographic techniques can be used to pattern the optical antenna elements or other parts of the optical antenna assembly into a more complex shape to form, for example, curves, angles, or discontinuous structures such as may be used to produce impedance matching structures, phase control structures, diodes, transistors, capacitive structures, inductive structures, resistive structures, vias, or other structures, including those that can be more complex or include combinations of such structures. As one example, nanotube-based structures have been developed with integral bends that have been shown to be capable of providing nonlinear electrical responses. Such structures may act simultaneously as optical antenna elements and nonlinear devices. Lithographic techniques can therefore be used to repetitively produce a number of arrays of similar or dissimilar components quickly and accurately.

In a typical photolithographic process, a protective photoresist layer is deposited atop a substrate or other planar object that is formed from a semiconductor material or metal. The photoresist layer is patterned such as is generally known, with a variety of photo-based development processes. An exposed portion of the material is then etched or otherwise removed, for example, through ion beam or e-beam milling. While this embodiment of a process is disclosed herein, a number of other fabrication techniques may be appropriate. For example, direct e-beam lithography, lift-off techniques, nanogrowth or other techniques may be selected, depending upon the particular configuration, application, dimensions, or other factors.

Figure 4:
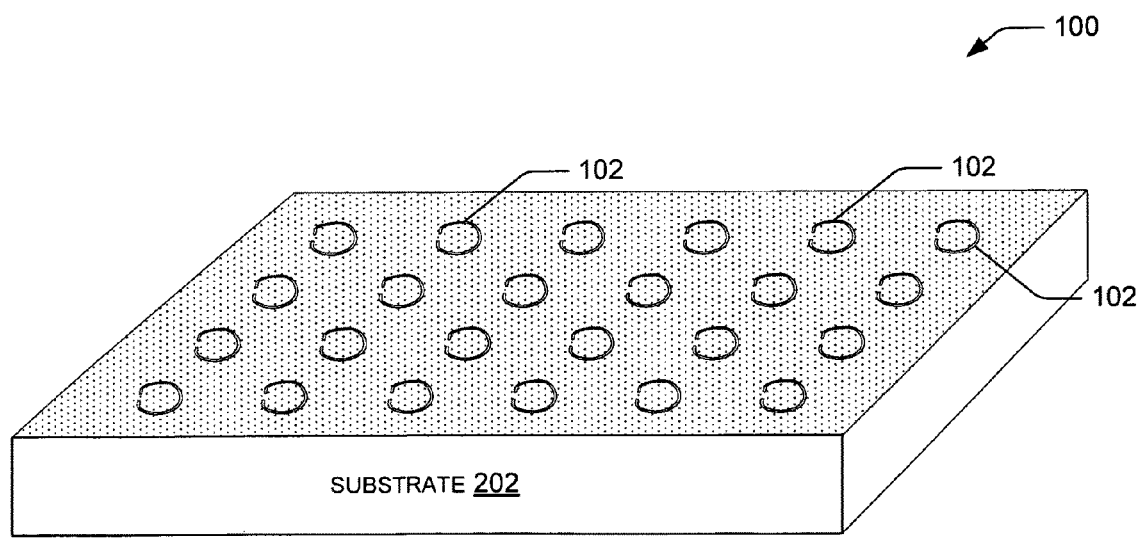
FIG. 4 is a perspective view of a portion of another embodiment of an optical antenna assembly.

FIG. 4 shows an embodiment of an optical antenna assembly 100, in which ring shaped optical antenna elements 102 are formed on the substrate 202 using lithographic techniques, such that the materials may be deposited according to known techniques. Deposition may be appropriate in a variety of configurations, including those where the optical antenna elements 102 can be on the order of some fraction of the wavelength of the incoming or outgoing light.

While the optical antenna elements 102 of FIG. 4 are presented as ring shaped, other geometric or non-geometric shapes may also be selected.

In one embodiment, each optical antenna element 102 may be formed with metals as gold, silver, aluminum, or copper. The antenna element material may be provided, for example, by electrochemical deposition, physical-vapor deposition, chemical vapor deposition, or may be grown in a variety of manners. In certain embodiments, the optical antenna elements may also be formed from semiconductor or similar materials such as carbon or silicon based materials that can be typically doped or otherwise combined with additional materials. In one embodiment, the metal and/or semiconductor materials of the optical antenna element can be selected to have a relatively high electron mobility. High electron mobility materials have been developed to operate at relatively high frequencies. For example, terahertz band high electron mobility devices have been reported.

Minimum achievable dimensions of features produced by semiconductor or similar fabrication techniques are steadily decreasing. The current level of dimensions can produce many embodiments of the optical antenna elements. For example, integrated circuit manufacturers have released commercial devices with dimensions below 100 nm and have announced plans for dimensions to a few tens of nanometers. It is expected that the precision, dimensional control, manufacturability and other aspects of the structures and methods described herein may benefit from such technological developments. Such technological developments may be expected to produce optical antenna elements having dimensions on the order of a few tens of nanometers. In some cases, optical antenna elements can have high vertical aspect ratios, for example 10:1 or greater A dipole optical antenna element, or a non-regular antenna, of 700 nm, 350 nm, or 175 nm is therefore realizable using current technologies.

Another technique that can be used to generate a number of embodiments of optical antenna elements is e-beam lithography. Using e-beam techniques, the user can precisely control the shape and dimensions of a feature that is being produced. Many embodiments of e-beam techniques provide for higher precision than current lithographic techniques, and provide for forming features having dimensions down to a couple of nanometers. As such, there can be a variety of techniques to form an array of minute optical antenna assemblies. One relatively straight-forward technique involves fabricating the optical antenna elements as metal lines on a substantially uniform semiconductor silicon substrate, or alternatively on a complex substrate such as a silicon-on-insulator (SOI) substrate, a silicon-on-sapphire substrate, a silicon-on-diamond substrate, or any other suitable configuration of substrate (or other item that is configured to maintain the relative position of the optical antenna elements) using conventional semiconductor manufacturing approaches. Other materials, including semiconductors, dielectrics, or conductors can form the substrate.

Figure 5A:
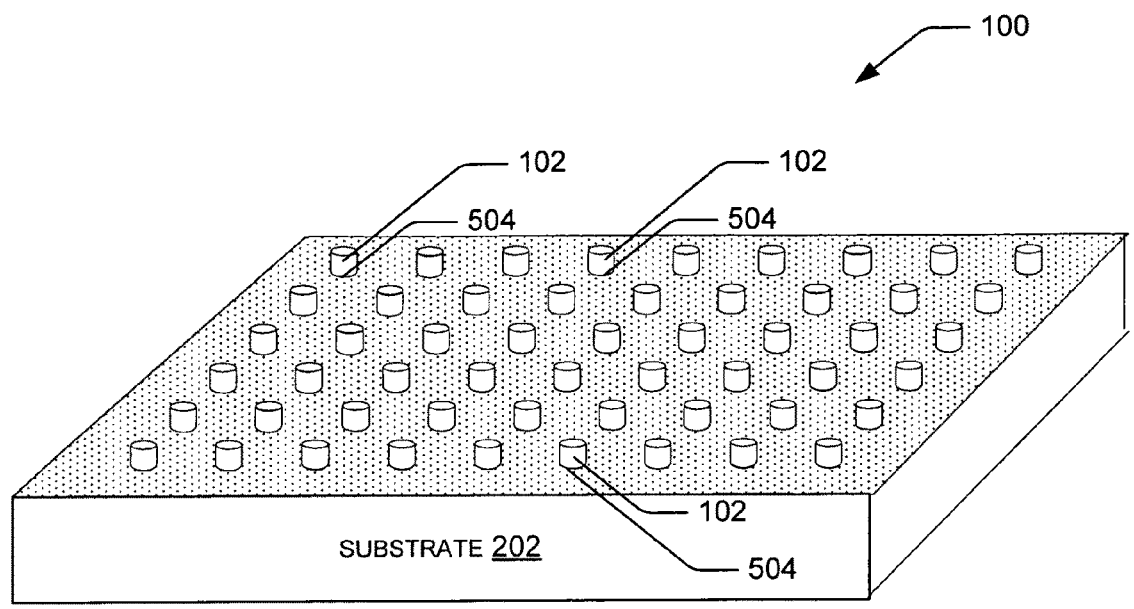
FIG. 5a is an isometric representation of a portion of another embodiment of an optical antenna assembly that is produced with nanotubes.
Figure 5B:
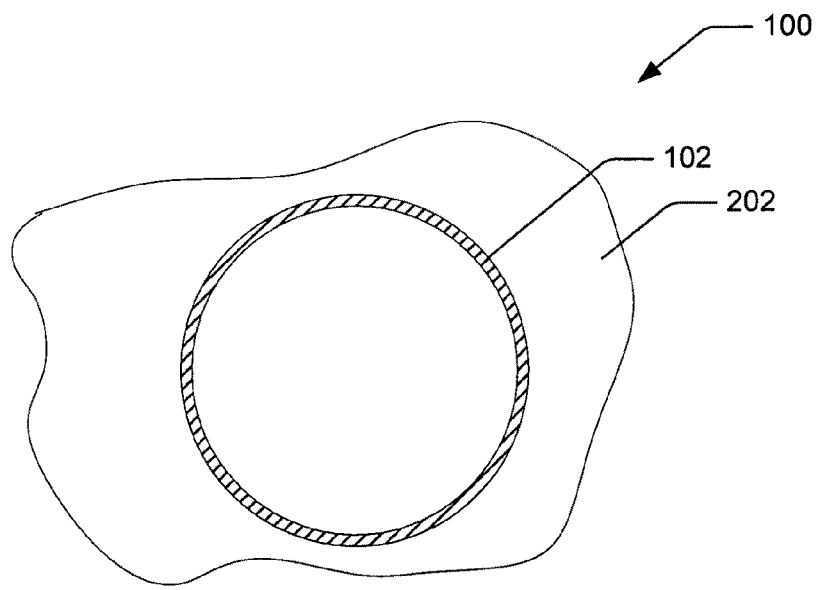

FIGS. 5a and 5b show one embodiment of the optical antenna assembly 100, including each of a plurality of nanotubes that form the array of optical antenna elements 102 as carried by the substrate 202. Optical antenna assemblies can include a large number and variety of configurations of optical antenna elements, and can be formed as dipoles, curved structures, discontinuous structures, etc. can be grown using carbon-based nanostructure technology (e.g., using carbon-based or other nanotubes). A large number of nanotubes can be grown to form an array of optical antenna elements using nano-structure techniques by, for example, having minute depressions initially being formed as a pattern upon a substrate using such techniques as lithography. The locations of the one or more depressions correspond to the desired locations of the nanotubes to be grown. The patterned substrate is then located in a deposition chamber for as long as desired depending upon the length of the nanotubes. The locations of the patterned depressions can be referred to in this disclosure as "seed regions" 504 since the nanotubes can be selectively grown at the location of the patterned depressions. Typically, nanotubes form as thin structures, ranging from one to tens of molecules in diameter for different embodiments of the nanotubes. While the exemplary embodiment herein is described as including ones to tens of molecules, in some applications, nanotube diameters may exceed such dimensions.

In the nanotubes, each optical antenna element 102 may be grown at the location of a defect in a substrate. In certain embodiments, the nanotubes can be grown at an angle with respect to the surface (including parallel to the surface). Each optical antenna element can have different, or even random, angular orientation with respect to the surface of the substrate. In different embodiments, each nanotube can be fabricated straight, or fabricated as having some curvature. In this disclosure, the curvature can be considered as a non-regular antenna configuration that is differentiated from the regular dipole antenna configuration. The duration of growth and the rate of growth determine the resulting desired height, angle, and curvature of each nanotube.

In certain embodiments, certain nanotubes can be even crossed or crossed and joined to form an intersection point. As such, if a nanotube of a particular height is desired to be formed, then the nanotube can be allowed to grow for a prescribed time duration corresponding to that length and rate of growth. Such approaches have been applied to produce nonlinear devices such as transistors, diodes, and field emission structures, as described for example in M. Ahlskog, R. Tarkiainen, L. Roschier, and P. Hakonen, *Single-electron transistor made of two crossing multiwalled carbon nanotubes and its noise properties*, Applied Physics Letters Vol 77(24) pp. 4037-4039. Dec. 11, 2000; and Cumings and Zettl, *Field emission and current-voltage properties of boron nitride based field nanotubes*, FIG. 5b shows a top view of one embodiment of the nanotubes as shown in FIG. 5a. Multiple nanotubes that form an array can be grown to a uniform height, or different heights, as desired. Many embodiments of the nanotubes can be carbon-based, although any suitable material that can be used and is within the intended scope of the present disclosure.

The array of the optical antenna elements 102 as described with respect to FIGS. 5a and 5b can therefore be arranged in a one-dimensional, two-dimensional, or three dimensional nano-structure pattern, and may be either formed in a regular or an irregular pattern. The embodiments of optical antenna elements 102 that are described with respect to FIGS. 3, 4, and 5a may be used to fabricate either the generating or receiving optical antenna elements 102 within the respective generating or receiving optical antenna assembly 100. A number of the different embodiments of the patterns of optical antenna elements 102 that form an array in the optical antenna assembly 100 are described later in this disclosure.

A number of nanotube-based optical antenna element fabrication techniques can use crystalline procedures, can use polymers, or even can use biologically inspired polymers (such as deoxyribonucleic acid (DNA) or proteins). The structure of the resulting nanotubes can be crystalline. In certain embodiments, nanotubes can be conceptually formed as a crystalline structure by forming a planar graph graphene sheet into a cylinder, and capping the ends of the cylinder with a semi-spherical "buckyball". Other configurations of, and processes for, forming nanotubes or similar structures can also be within the intended scope of the present disclosure. The crystalline approaches (including, but not limited to, nanotubes and other nano-structures) might be more suitable to optical antenna elements that can be arranged in a pattern perpendicular to the plane formed by the waveform, either for a generating or receiving optical antenna element. There can be, however, also a number of different configurations of antenna design. Many optical antenna assembly designs can leverage existing knowledge of optical systems that operate, for example, in the microwave or millimeter range. Depending on the particular embodiment, such optical antenna assemblies could be applied to either broadband or narrow-band antenna applications.

A number of different configurations of receiving optical antenna assembly configurations can operate as detectors. One embodiment of the optical antenna assembly simulates human vision by providing three arrays of tuned optical antenna elements, with each one of the three arrays being optimized or tuned for operation at the light frequencies that is particularly detectable by human vision (red, green, and blue wavelengths of light). Each of the three arrays of optical antenna elements can be formed as a distinctive ring. For example, in one embodiment of an optical antenna assembly, three arrays of optical antenna elements 102 form three concentric ring arrays (or other shapes of arrays) that can each be configured/colored as red, green, and blue light-receiving rings (not shown).

While the above describes an embodiment of the receiving optical antenna assembly that detects a plurality of light frequencies corresponding to colors such as red, green, and blue; it is also within the intended scope of the present disclosure to provide multi-colored generating optical antenna assemblies that generate or receive other ranges of multi-colored light. Such multi-colored generating or receiving optical antenna assemblies may be applicable to display and projector applications, such as is likely for next generation television, display, projector, computer, theater, or other similar applications. In other frequency ranges, the multi-color or dual-color receiving or generating optical antenna assemblies may be configured to operate in other visible light ranges, or infrared or ultraviolet ranges.

Generating or receiving optical antenna assemblies may be configured to generate/receive light of a variety of distinct frequencies, frequency ranges, or combination of frequencies or frequency ranges, while remaining within the scope of the present disclosure. For example, it may be desired to use optical antenna elements that can generate or receive light in the near infrared or near ultraviolet light spectrum, as may be useful for a variety of applications, including thermal imaging, ultraviolet illumination or detection, or any other appropriate application. In other embodiments, it may be desired to generate/receive light using a single frequency. Such transmission or detection may provide more selectivity, simplified detection, synchronous operation, and/or reduced cost or complexity. The particular light application should be considered when determining the frequency of the generated or received optical energy.

Examples of Optical Antenna Phase Techniques

Figure 6:
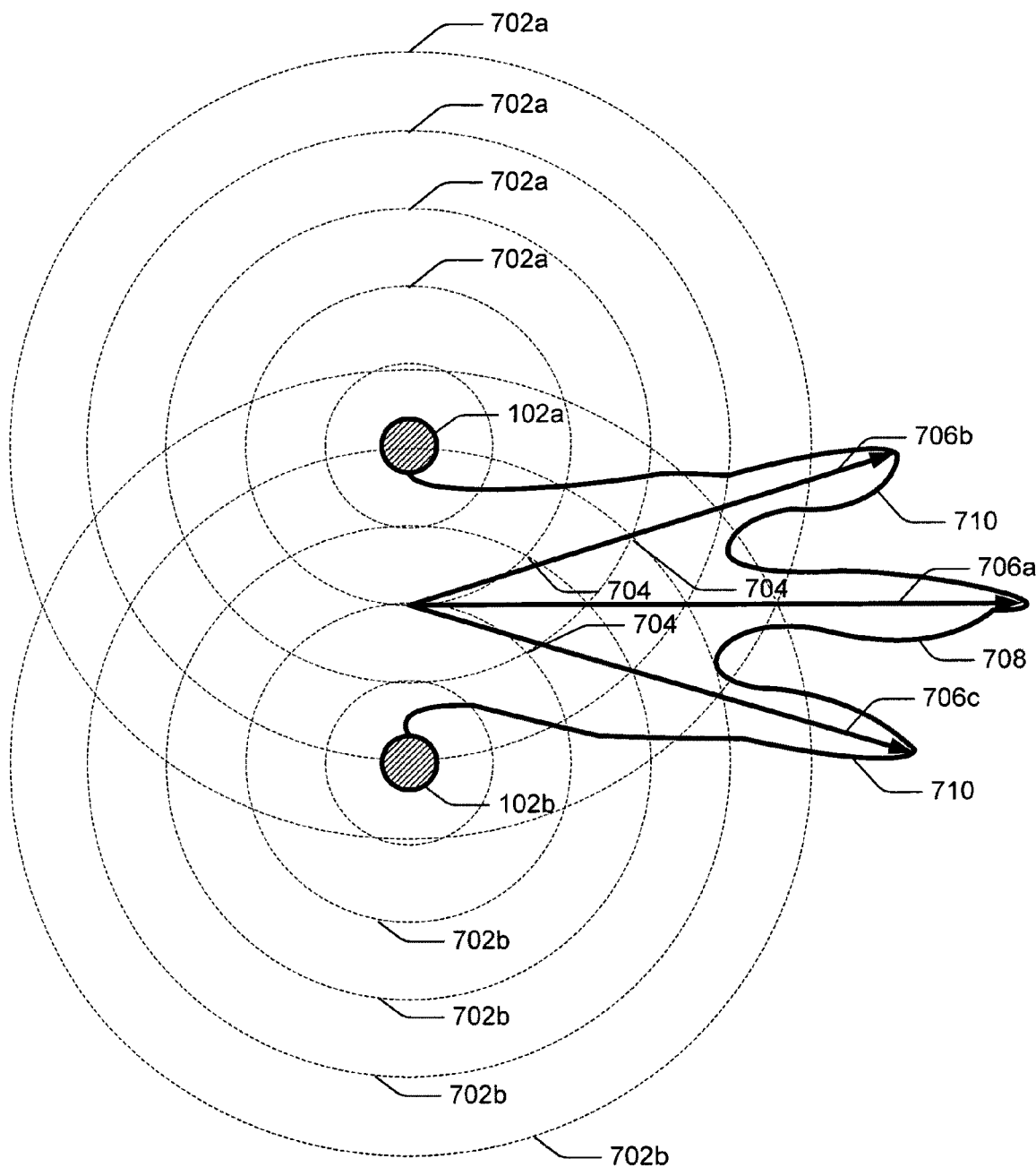
FIG. 6 is a view of one embodiment of an interference pattern created by a plurality of optical antenna elements.
Figure 7:
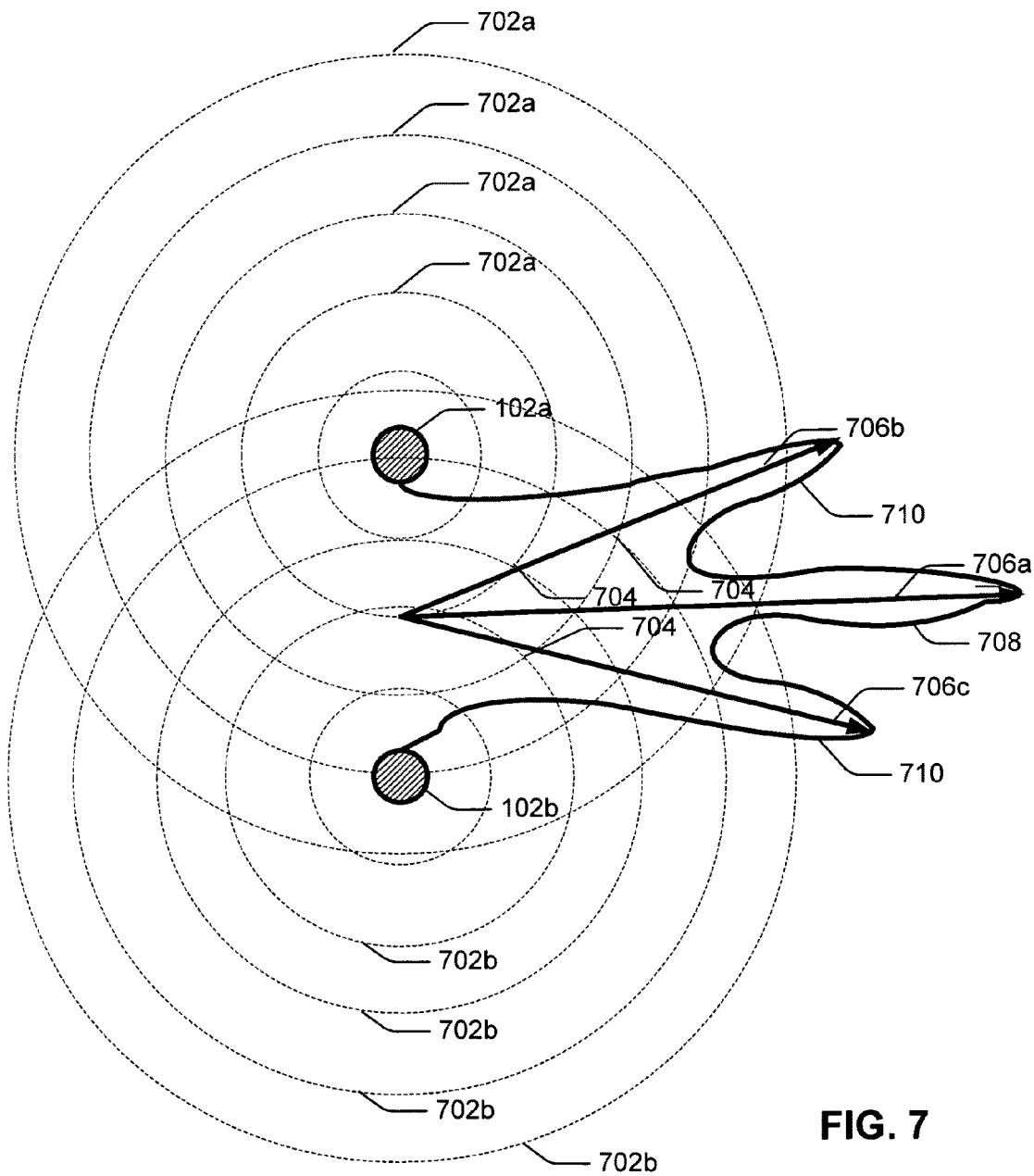
FIG. 7 is a view of another embodiment of an interference pattern created by the plurality of optical antenna elements of FIG. 6, in which that relative phase of one of the optical antenna elements is shifted.

FIG. 6 displays one embodiment of signals, which may be sinusoidal, being generated by a plurality of optical antenna elements 102a and 102b that together forms an associated signal-strength graph. FIG. 7 displays one embodiment of FIG. 6 in which the highest amplitude generated light is beamsteered upwardly by a few degrees with respect to FIG. 6. While an array of optical antenna elements 102 would typically include a large number of elements; only two optical antenna elements 102a and 102b are illustrated in FIGS. 6 and 7 for clarity in describing certain beamforming and beamsteering techniques. These concepts can be extended to much larger arrays of optical antenna assemblies 100. Each optical antenna element 102a and 102b radiates signal patterns such as are illustrated in FIGS. 6 and 7 as respective signal lines 702a and 702b.

The respective signal lines 702a and 702b generated by the optical antenna elements 102a and 102b are represented in the drawing as being radiated in a generally hemispherical pattern. One skilled in the art will recognize that the actual emission pattern from each of the elements, including amplitude and phase, may depend upon the configuration of the individual antenna element and on the materials and/or structures of, surrounding, or near the individual elements. Thus, patterns other than hemispherical may be within the scope of this disclosure, though hemispherical is selected for clarity of presentation of the concepts herein. Further, the description of propagation and interaction of waves herein is simplified to a case where the waves are typically of the same wavelength. This aspect lends itself in many cases to coherent wave interaction. One skilled in the art will recognize that variations in frequency, differences in frequency, non-coherent concepts, and other types of interaction and related techniques and principles may be applicable for certain configurations or applications of the methods and structures described herein.

Also, only two-dimensions of the spherical pattern of the signal lines 702a and 702b are shown in FIGS. 6 and 7 for clarity of illustration, though typically, such configurations would be analyzed in three dimensions using known techniques for analyzing beam propagation and interference. Each signal line 702a and 702b represents, for example, a crest of a sinusoidal pattern that is formed by respective optical antenna elements 102a and 102b. The location where the signal lines 702a and 702b intersect represents those phase intersection points 704 where the signal lines 702a and 702b correspond to each other (are both at a crest), and therefore can be in phase.

FIGS. 6 and 7 illustrate a number of phase intersection lines 706 that pass through many of the phase intersection points 704. The largest and, typically, the strongest of the phase intersection lines 706a corresponds to a main lobe 708 as shown in the signal strength plot.

The phase intersection lines 706a, 706b, and 706c determine the locations where waves constructively add to form amplitude peaks. Two additional phase intersection lines 706b and 706c correspond to side lobes 710 in the signal strength plot in FIGS. 6 and 7. At any location along the phase intersection lines 706a, 706b, and 706c, the signals from both optical antenna elements 102a and 102b add constructively. As such, the phase intersection lines 706a, 706b, and 706c typically correspond to the highest light amplitude regions of the optical antenna assembly.

While FIGS. 6 and 7 present a simplified presentation of coherent interaction, and demonstrate how formation of the main lobe 708, as well as the side lobes 710, or the general direction of the phase intersection lines 706a, 706b, and 706c follow antenna pattern techniques and concepts, the availability of many elements and the control of element positioning will often permit much more flexibility in relative position, number, orientation, and other characteristics of the antenna assembly. Designs utilizing such flexibility can be developed using conventional analytical or computer based techniques for designing or analyzing arrays of antenna elements.

Moreover, while FIGS. 6 and 7 illustrate either generating antenna patterns according to the generating optical antenna elements 102a and 102b, such antenna pattern concepts can be also applicable to receiving optical antenna elements. Antenna patterns, for both the generating and receiving optical antenna elements 102a and 102b, correspond largely to the relative phase and amplitude of the light-waves as indicated by the respective signal lines 702a and 702b. For example, FIG. 7 shows that changing the phases of the respective signal lines 702a and 702b can change the location of the phase intersection lines 706a, 706b, and 706c as well as the characteristics of the main lobe 708 and the side lobes 710 (characterized by the location, relative magnitude, width, or other features). FIG. 7 illustrates the effect of shifting the phase of the wave generated or received by the lower optical antenna elements by some amount with respect to the waves generated/received by the upper optical antenna element.

As such, the phase of the lower optical antenna element 102b is altered (e.g. steered ahead) with respect to the phase of the upper optical antenna element 102a by 180 degrees. This process of shifting the phase of the signal that is generated by at least one of the optical antenna elements 102 with respect to another of the optical antenna elements to control directionality of the optical antenna assembly is referred to herein as beamsteering for convenience, though the concept of controlling the structure, direction and/or shape of the antenna pattern may be addressed in contexts other than directing a beam of energy.

One skilled in the art will recognize that other actions relative to controlling phase or relative phase may be directed toward other effects as well, including possible lobe optimization, wave coupling, or other effects. Moreover, the discussion herein has omitted the effects of polarization or E-field orientation to simplify the presentation of the concepts and principles. One skilled in the art will recognize that a variety of analytical, experimental, and other techniques, as well as a variety of structures may be applied to design, implement, analyze or otherwise treat or understand polarization effects.

Beamsteering can also shift the relative positions of the main lobe 708 and the side lobes 710 with respect to the optical antenna elements 102a and 102b. Note, for example, that the main lobe 708 and the side lobes 710 as described with respect to FIG. 7 are rotated in a generally counter-clockwise direction when compared to FIG. 6. In a simplistic example, increasing a gradient of the phase difference between waves from different optical antenna elements increases shifting of the main lobes and/or the side lobes. While the concept of beamsteering may become more computationally involved as the number of the optical antenna elements in an array is increased, conventional approaches can still be used.

This disclosure provides a number of embodiments of techniques by which beamsteering, beamforming, antenna pattern control, or other adaptive antenna techniques can be applied to optical antenna assemblies 100. Other embodiments of beamsteering and beamforming techniques across a variety of arrays of optical antenna elements 102 may be within the intended scope of the present disclosure.

As noted above, in some applications, the optical antenna elements may be fabricated according to photolithographic or similar techniques and may be on the order of a portion of an optical wavelength or a few optical wavelengths. Consequently, in some configurations an optical antenna assembly may include a large number, several thousand or even millions of antenna elements 102. Moreover, in some configurations, a 1,000 by 1,000 element array may have a cross-sectional area on the order of 1 mm by 1 mm. Such a small assembly may be useful as a component of a variety of light capturing devices or systems, such as cameras, copiers, scanner, optical detectors, or may be useful in many other light capturing configurations. Additionally, components of such size may be useful in light emissive applications ranging from illumination to coherent beam generation.

While compact assemblies may have inter-element spacings on the order of a portion of a wavelength to a few wavelengths, in some applications it may be desirable to have larger inter-element spacings. Such arrangements with increased spacing between the optical antenna elements may be applied to such applications as synthetic aperture radar (SAR) systems, sparse antenna arrays, radio telescopes, or the like.

Software that has been developed for, and supports the so-called "synthetic aperture technique" and interferometric approaches. Such software can be run, for example, in association with the optical antenna controller 1700 as described below with respect to FIGS. 20, 17, 18, and 19.

Embodiments of Receiving and Modulating Approaches

In embodiments of optical antenna elements 102 that receive light as described with respect to FIG. 1, it often is desired to detect or otherwise process electrical energy generated within or around one or more of optical antenna elements 102 responsive to the optical antenna element. In many embodiments, it may be useful to process the electrical energy at frequencies approaching the frequency of the incident light or to process the electrical energy synchronously. While conventional commercial electronic devices do not typically operate synchronously at optical frequencies, the principles upon which such devices can be designed and fabricated can be extensible to such frequencies, though many effects, such as skin depth, that may be ignored at lower frequencies may become significant at such higher frequencies. In fact, such analyses are regularly presented and verified experimentally in the literature relating to "plasmons" or "polaritons".

Within this disclosure, the signals (in both transmitting and receiving embodiments of optical antenna assemblies) include any propagation, including polaritons and phononic. As such, in this disclosure, when reference is made to energy traveling or propagating along an electrical path, it is intended that the propagation can include within, adjacent to, outside of, parallel to, through, and any other known conduction mechanism relative to an electrical path.

Descriptions of surface plasmon polaritons and related structures, fabrication techniques and analyses can be found at "*Terahertz surface plasmon polaritons*"; THz SPP's; printed on Dec. 22, 2004; pp. 1-4; located at: http://www-users.rwth-aachen.de/jaime.gomez/spp.html; N. Ocelic, R. Hillenbrand; "*Subwavelength-scale tailoring of surface phonon polaritons by focused ion-beam implantation*"; Nature Materials-Letters; September 2004; pp. 606-609; Volume 3; Nature Publishing Group; M. Salerno, J. R. Krenn, B. Lamprecht, G. Schider, H. Ditlbacher, N. Felidj, A. Leitner, F. R. Aussenegg; "*Plasmon polaritons in metal nanostructures: the optoelectronic route to nanotechnology*"; Opto-Electronics Review; Dec. 22, 2004; pp. 217-224; Volume 10, Number 3; G. Schider, J. R. Krenn, A. Hohenau, H. Ditlbacher, A. Leitner, F. R. Aussenegg, W. L. Schaich; I. Puscasu, B. Monacelli, G. Boreman; "*Plasmon dispersion relation of Au and Ag nanowires*"; Physical Review B; 2003; pp. 155427-1/155427-4; Volume 68, Number 15; The American Physical Society; and N. Stoyanov, D. Ward, T. Feurer, K. Nelson; "*Terahertz polariton propagation in patterned materials*"; Nature Materials-Letters; October 2002; pp. 95-98; Volume 1; Nature Publishing Group; and J. P. Kottmann, Olivier J. F. Martin; "*Plasmon resonant coupling in metallic nanowires*"; Optics Express; Jun. 4, 2001; pp. 655-663; Volume 8, Number 12, each of which is incorporated herein by reference.

Examples of surface-plasmon analysis, structures, techniques and design relative to optical fields and propartion can be found in S. Bozhevolnyi, I. Smolyaninov; A. Zayats; "*Near-field microscopy of surface-plasmon polaritons: Localization and internal interface imaging*"; Physical Review B; Jun. 15, 1995; pp. 17916-17924, FIGS. 3, 5, 7, 9, 11; Volume 51, Number 24; The American Physical Society; W. L. Barnes, W. A. Murray, J. Dintinger, E. Devaux, T. W. Ebbesen; "*Surface Plasmon Polaritons and Their Role in the Enhanced Transmission of Light through Periodic Arrays of Subwavelength Holes in a Metal Film*"; Physical Review Letters; Mar. 12, 2004; pp. 107401-1/107401-4; Volume 92, Number 10; The American Physical Society; H. Ditlbacher, J. R. Krenn, G. Schider, A. Leitner; F. R. Aussenegg; "*Two-dimensional optics with surface plasmon polaritons*"; Applied Physics Letters; Sep. 2, 2002; pp. 1762-1764; Volume 81, Number 10; American Institute of Physics, H. Cao, A. Nahata; "*Resonantly enhanced transmission of terahertz radiation through a periodic array of subwavelength apertures*"; Optics Express; Mar. 22, 2004; pp. 1004-1010; Volume 12, Number 6; I. I. Smolyaninov, A. V. Zayats, C. C. Davis; "*Near-field second harmonic generation from a rough metal surface*"; Physical Review B; Oct. 15, 1997; pp. 9290-9293; Volume 56, Number 15; The American Physical Society each of which is incorporated herein by reference.

In another approach, such analyses may be applied to negative refractive or left-handed materials, as described in R. Ruppin; "*Surface polaritons and extinction properties of a left-handed material cylinder*"; Journal of Physics: Condensed Matter; Aug. 13, 2004; pp. 5991-5998; Volume 16; IOP Publishing Ltd, and T. J. Yen, W. J. Padilla, N. Fang, D. C. Vier, D. R. Smith, J. B. Pendry, D. N. Basov, X. Zhang; "*Terahertz Magnetic Response from Artificial Materials*"; Reports; Mar. 5, 2004; pp. 1494-1496; Volume 303; Science Magazine; each of which is incorporated herein by reference.

With polaritons, energy may considered to be propagated adjacent, internal, and/or external to a guiding surface, such as a metal, nanotube, photonic crystal, or other material.

In considering the optical antenna assembly, the relatively high frequency of the light will impact the analysis and design. Light having a wavelength of, e.g., 500 nm has a frequency of approximately 600 Thz, while light having a wavelength of 30 microns has a frequency of about 10 THz and light having a wavelength of 300 microns has a frequency of about 1 THz. One skilled in the art will recognize that many commercially available components typically used for lower frequency assemblies may not yet be available at optical frequencies. However, as the scale of the optical antenna elements is reduced to within one or a few orders of magnitude relative to the wavelength of the optical waves, the capacitance, inductance, and other parameters will also scale. As operational frequencies of available components rise, the simplicity and manufacturability of such devices is expected to improve. More details regarding operation of certain embodiments of such components are discussed below with reference to mixing.

Moreover, several techniques are becoming available for integrating electronic or non-linear features into the optical antenna assembly. As noted above, for example, carbon nanotubes having diode-like features have been reported. Similarly, a number of nonlinear devices, such as transistors, have been integrated in or analyzed in conjunction with micro- or nanoscale structures such as nanotubes, and in some cases have been described as operating at terahertz ranges. Example techniques and descriptions can be found in the Ahlskog and Cumings references described above as well as:

J. U. Lee, P. P. Gipp, C. M. Heller; "*Carbon nanotube p-n junction diodes*"; Applied Physics Letters; Jul. 5, 2004; pp. 145-147; Volume 85, Number 1; American Institute of Physics; C. Lu, Q. Fu, S. Huang, J. Liu; "*Polymer Electrolyte-Gated Carbon Nanotube Field-Effect Transistor*"; Nano Letters; Mar. 12, 2004; pp. 623-627; Volume 4, Number 4; American Chemical Society; J. Guo, M. Lundstrom, S. Datta; "*Performance projections for ballistic carbon nanotube field-effect transistors*"; Applied Physics Letters; Apr. 29, 2002; pp. 3192-3194; American Institute of Physics; Z. Yao, H. W. C. Postma; L. Balents; C. Dekker; "*Carbon nanotube intramolecular junctions*"; Letters to Nature; Nov. 18, 1999; pp. 273-276; Volume 402; Macmillan Magazines Ltd.; J. Guo, S. Datta, M. Lundstrom; "*A Numerical Study of Scaling Issues for Schottky Barrier Carbon Nanotube Transistors*"; School of Electrical and Computer Engineering—Purdue University; printed on Dec. 22, 2004; pp. 1-26; A. Javey, J. Guo; M. Paulsson, Q. Wang, D. Mann, M. Lundstrom, H. Dai; "*High-Field Quasiballistic Transport in Short Carbon Nanotubes*"; Physical Review Letters; Mar. 12, 2004; pp. 106804-1/106804-4; Volume 92, Number 10; The American Physical Society; A. Javey, J. Guo, D. B. Farmer, Q. Wang, E. Yenilmez, R. G. Gordon, M. Lundstrom, H. Dai; "*Self-Aligned Ballistic Molecular Transistors and Electrically Parallel Nanotube Arrays*"; Nano Letters; Jun. 23, 2004; pp. 1319-1322; Volume 4, Number 7; American Chemical Society; A. Javey, J. Guo, D. B. Farmer, Q. Wang, D. Wang, R. G. Gordon, M. Lundstrom, H. Dai; "*Carbon Nanotube Field-Effect Transistors with Integrated Ohmic Contacts and High-k Gate Dielectrics*"; Nano Letters; Feb. 20, 2004; pp. 447-450; Volume 4, Number 3; American Chemical Society; J. Guo, J. Wang, E. Polizzi, S. Datta, Mark Lundstrom; "*Electrostatics of Nanowire Transistors*"; School of Electrical and Computer Engineering-Purdue University; printed on Dec. 22, 2004; pp. 1-23; A. Javey, J. Guo, Q. Wang, M. Lundstrom, H. Dai; "*Ballistic carbon nanotube field-effect transistors*"; Nature; Aug. 7, 2003; pp. 654-657; Volume 424; Nature Publishing Group; J. Guo, S. Goasguen, M. Lundstrom, S. Datta; "*Metal-insulator-semiconductor electrostatics of carbon nanotubes*"; Applied Physics Letters; Aug. 19, 2002; pp. 1486-1488; Volume 81, Number 8; American Institute of Physics; S. Li, Z. Yu, S. Yen, W. C. Tang, P. J. Burke; "*Carbon Nanotube Transistor Operation at 2.6 GHz*"; Nano Letters; Mar. 23, 2004; pp. 753-756; Volume 4, Number 4; American Chemical Society; I. Y. Lee, X. Liu, B. Kosko, C. Zhou; "*Nanosignal Processing: Stochastic Resonance in Carbon Nanotubes That Detect Subthreshold Signals*"; Nano Letters; Nov. 11, 2003; pp. 1683-1686; Volume 3, Number 12; American Chemical Society; each of which is incorporated herein by reference.

An example of one detector is described in W. Knap, Y. Deng, S. Rumyantsev, and M. S. Shur; "*Resonant detection of subterahertz and terahertz radiation by plasma waves in submicron field-effect transistors*"; Applied Physics Letters; Dec. 9, 2002; pp. 4637-4639; Volume 81, Number 24; American Institute of Physics; and in J. Ward, F. Maiwald; G. Chattopadhhyay, E. Schlecht, A. Maestrini, J. Gill, I. Mehdi; "*1400-1900 GHz Local Oscillators for the Herschel Space Observatory*"; Dec. 22, 2004; each of which is incorporated herein by reference.

Antenna elements with integrated nonlinear devices can operate as either or both of optical antenna elements 102 and mixers. In one mixing-type of approach, the electrical energy may be mixed or otherwise compared to a second electrical signal produced in response to a reference optical signal. In some approaches, such as heterodyning, a high frequency signal is mixed with a reference signal in a nonlinear device, such as a diode or transistor to produce signals having a frequency corresponding to a difference between the high frequency signal and the reference signal. In one approach the reference signal is generated with a local oscillator, according to techniques such as those described for example in A. Maestrini, J. Ward, J. Gill; G. Chattopadhyay, F. Maiwald, K. Ellis, H. Javadi, I. Mehdi; "*A Planar-Diode Frequency Tripler at 1.9 THz*"; 2003 IEEE MTT-S Digest; January 2003; pp. 747-750; J. Ward, G. Chattoppadhyay, A. Maestrini, E. Schlecht; J. Gill, H. Javadi, D. Pukala; F. Maiwald; I. Mehdi; "*Tunable All-Solid-State Local Oscillators to 1900 GHz*"; Dec. 22, 2004, each of which is incorporated herein by reference.

In some applications, information content of the optical signal may be detected synchronously, through optical or electrical approaches. In one optical approach, an optical reference signal is applied to one or more antenna elements to produce a reference electrical signal.

The reference electrical signal and the electrical signal corresponding to the received optical signal can be mixed, in a nonlinear or similar signal processing device, such as a transistor, diode, or bolometer to produce a downconverted signal component that may be processed further. As noted previously, the nonlinear device may be integral to or integrated with the optical antenna elements 102.

In some approaches, it may be adequate to process incoming optical energy without specific phase information. In one such approach, the antenna elements 102 convert incoming optical energy to electrical energy and the electrical energy is integrated or accumulated over some time duration. An example of a radiation detector that uses the bolometer effect is described in the article: G. N. Gol'tsman, A. D. Semenov; Y. P. Gousev; M. A. Zorin; I. G. Gogidze; E. M. Gershenzon; P. T. Lang; W. J. Knott; K. F. Renk; "*Sensitive picosecond NbN detector for radiation from millimeter wavelengths to visible light*"; Supercond. Sci. Technol.; 1991; pp. 453-456; TOP Publishing Ltd, which is incorporated by reference as well as in other references previously incorporated herein.

In one approach, the accumulated electrical energy can be detected using conventional electronic techniques. In other approaches, electrical energy can be detected and/or measured using photonic techniques similar to those described in G. Schider, J. R. Krenn, A. Hohenau, H. Ditlbacher, A. Leitner, F. R. Aussenegg, W. L. Schaich; I. Puscasu, B. Monacelli, G. Boreman; "*Plasmon dispersion relation of Au and Ag nanowires*"; Physical Review B; 2003; pp. 155427-1/ 155427-4; Volume 68, Number 15; J. R. Krenn; "*Nanoparticle Waveguides Watching energy transfer*"; News & Views; April 2003; pp. 1-2; Volume 2; Nature Materials; or Nature Materials-Letters; September 2004; pp. 606-609; Volume 3; Nature Publishing Group, each of which is incorporated herein by reference.

Figure 8:
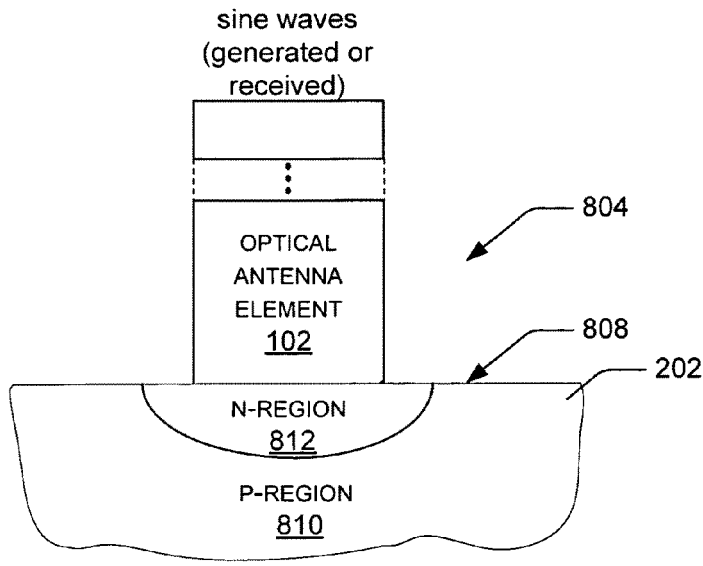
FIG. 8 is a side view of one embodiment of the optical antenna element and an associated detector, in which the detector is configured as a diode.

As noted previously, different embodiments of the signal processing components that can be associated with each optical antenna element can be configured as diodes, transistors, or other components as described in this disclosure. In the FIG. 8 embodiment, the optical detector 804 is configured as a diode 808. There can be variety of embodiments of diodes 808 that can be used. In FIG. 8, the diode 808 is represented conventionally with a p-region 810 that is positioned adjacent to an n-region 812, though a variety of structures may be applicable. Such p-regions 810 and n-regions 812 are typically formed by doping according to known techniques. One skilled in the art will recognize that other diode or other nonlinear structures may be appropriate for certain applications. For example, planar diode multipliers, Schottky diodes, field emission devices, and HEMT devices are described hereinbelow and in various references incorporated herein. In many cases the particular component may be designed specifically to interact with its respective one or more optical antenna elements 102.

For example, in many embodiments, the magnitude of the electrical signal produced by the one or more of the optical antenna elements 102 corresponds to the amplitude of the optical wave interacting with it. In some applications, the electrical signal will propagate in a manner corresponding to its frequency and the structure of the optical antenna elements 102 and the electrical conductor. For example, where the electrical signal is at very high frequencies, it is likely to be carried in the form of a plasmon. The plasmon is guided by the electrical conductor or by the optical antenna element to, or near, the nonlinear component, where the plasmon may produce a change in an electric field in, around, adjacent to or otherwise interacting with the component. The component responds to the interaction by producing a corresponding output electrical signal. A variety of interacting approaches may be applicable.

Figure 9:
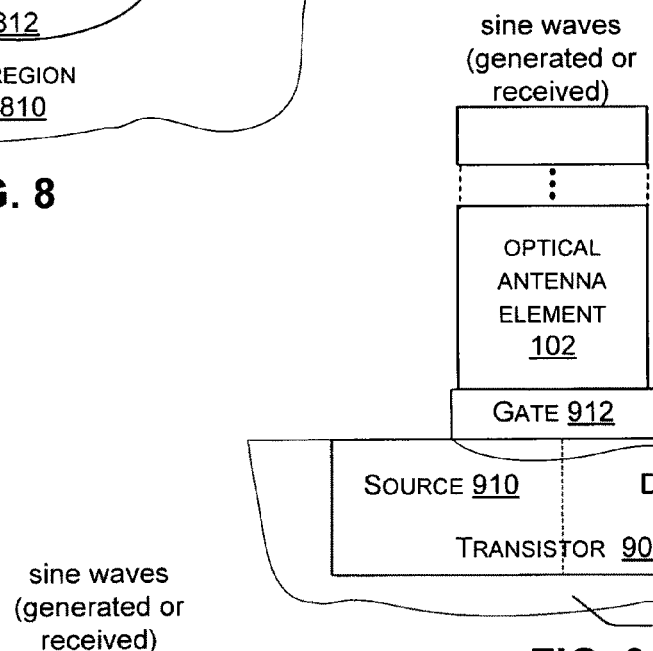
FIG. 9 is a side view of another embodiment of the optical antenna element and an associated detector, in which the detector is configured as a transistor.

The optical antenna elements and their associated signal processing components, as described with respect to FIGS. 8 and 9, may include a nonlinear device such as a diode or transistor integrated with or coupled to optical antenna elements. As shown in a diagrammatic representation in FIG. 8, the n-region 812 of diode 808 carries an optical antenna element 102. The n-region 812 is integrated into a substrate 202 that includes a p-region 810. As is known adjoining n and p-regions can form a diode, thus forming a nonlinear device. As is also known, nonlinear devices, such as diodes can form portions of rectification or signal processing circuitry. While the diagrammatic representation of FIG. 8 shows the diode being physically discrete from and carrying the optical antenna element 102, the diode may be incorporated into the diode as is noted hereinbelow. Moreover, although the representational diode 808 of FIG. 8 includes a pn-junction, other configurations, such as those including Schottky diodes may be more appropriate in some configurations. Such diodes and integration with waveguides, nanotubes, and other components are referred to hereinbelow and in several of the references incorporated herein by reference.

In a transistor type of implementation presented in FIG. 9, an optical detector 804 that responds to the electrical signal induced in the optical antenna element 102 includes a transistor 908. The embodiment of transistor 908 that is described with respect to FIG. 9 is a field-effect transistor (FET), as indicated by the identity of the terminals (a source 910, a gate 912, and a drain 914), though other transistor configurations may be appropriate in some configurations, as noted below.

In this embodiment, the optical antenna element 102 is coupled to the gate 912 and the source 910 and drain 914 can be biased in a conventional manner. The details of biasing and other electronic circuitry can be represented diagrammatically, as the details of the electronic circuitry will depend upon the application, frequency, and configuration. Specific examples of electronic circuitry coupled to transistor-like elements at far infrared frequencies are reported for waves arriving at an antenna structure in J. C. Pearson, I. Mehdi, E. Schlecht, F. Maiwald, A. Maestrini, J. Gill, S. Martin, D. Pukala, J. Ward, J. Kawamura, W. R. McGrath, W. A. Hatch, D. Harding, H. G. Leduc, J. A. Stern, B. Bumble, L. Samoska, T. Gaier, R. Ferber, D. Miller, A. Karpov, J. Zmuidzinas, T. Phillips, N. Erickson, J. Swift, Y.-H. Chung, R. Lai, H. Wang; "*THz Frequency Receiver Instrumentation for Herschel's Heterodyne Instrument for Far Infrared (HIFI)*"; Dec. 22, 2004, incorporated herein by reference.

Similarly, coupling of nanotubes to transistors and integration of nanotubes with transistors have been described in the references, e.g. A. Javey, J. Guo, D. B. Farmer, W. Wang, E. Yenilmez, R. Gordon, M. Lundstrom, and H. Dai, "*Self-Aligned Ballistic Molecular Transistors and Electrically Parallel Nanotube Arrays,*" Nano Letters, vol. 4, p. 1319, 2004; A. Javey, J. Guo, D. B. Farmer et al., "*Carbon Nanotube Field-Effect Transistors With Integrated Ohmic Contacts and High-k Gate Dielectrics,*" Nano Letters, vol. 4, p. 447, 2004; J. Guo, J. Wang, E. Polizzi, Supriyo Datta and M. Lundstrom and H. Dai, "*Electrostatics of Nanowire Transistors,*" IEEE Transactions on Nanotechnology, vol. 2, p. 329, December, 2003; and A. Javey, J. Guo, Q. Wang, M. Lundstrom and H. Dai, "*Ballistic Carbon Nanotube Field-Effect Transistors,*" Nature, vol. 424, p. 654, 2003 each of which is incorporated herein by reference.

Returning to the description of exemplary transistor 908, upon arrival of an optical wave at the optical antenna element, the induced electrical signal in the optical antenna element 102 produces a change in a field in the gate 912 of the transistor that produces a corresponding amplified output according to principles of transistor operation. The transistor may be configured for additional gain, selectivity, or interaction with the electronic circuitry. For example, the channel width and other parameters may be configured to be resonant at a frequency corresponding to the frequency of an input wave. An example of transistors configured for resonant operation is described in V. Ryzhii, I. Khmyrova, M. Shur; "*Terahertz photomixing in quantum well structures using resonant excitation of plasma oscillations*"; Journal of Applied Physics; Feb. 15, 2002; pp. 1875-1881; Volume 91, Number 4; American Institute of Physics and in W. Knap, Y. Deng, S. Rumyantsev, M. S. Shur; "*Resonant detection of subterahertz and terahertz radiation by plasma waves in submicron field-effect transistors*"; Applied Physics Letters; Dec. 9, 2002; pp. 4637-4639; Volume 81, Number 24; American Institute of Physics.

It is noted that the components of the traditional diode (see FIG. 8) or a Schottky diode 1003 (FIG. 10), or the transistor that is associated with the optical antenna element 102 (see FIG. 9) can either be formed either on, or in, the substrate 202 as shown in FIGS. 3, 4, 5a, and 5b. As device speeds increase due to improvements in technology, the particular device that is selected to be associated with the optical antenna assembly may vary depending upon the application, configuration, frequency, fabrication considerations, or other considerations. As such, in this disclosure, the particular processing or mixing devices described herein are illustrative in nature, and not limiting in scope.

Figure 10:
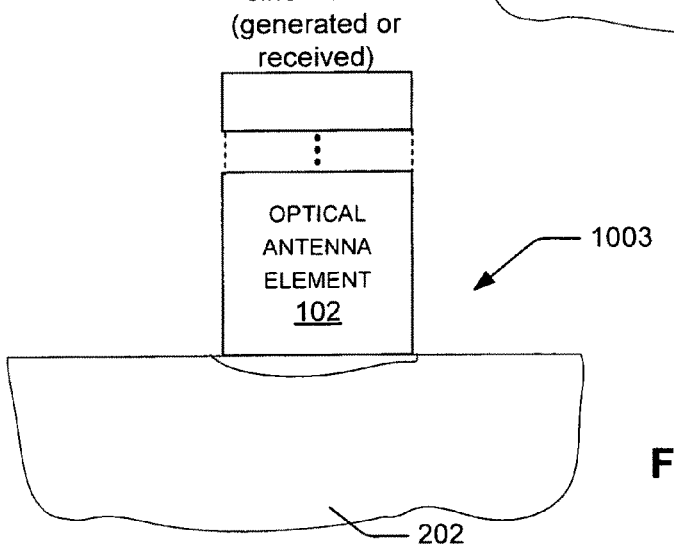
FIG. 10 is a side view of yet another embodiment of the optical antenna element and an associated detector, in which the detector is configured as a Schottky diode.

Moreover, many embodiments of the optical antenna elements 102 as described relative to FIGS. 8 and 1 through 5b can be formed partially or entirely with metal, semiconductors, carbon, or other materials that may be compatible with fabrication processes for many types of electronic components. Consequently, portions of the optical antenna elements 102 can correspond to or be integral with the portions of one or more Schottky diodes, transistors, or other components. For example, where an optical antenna element 102 is metal, it may be integral with or actually form an electrode of the Schottky diode 1003 as shown in FIG. 10.

In a number of embodiments, signal processing techniques may be used to process and/or transfer information derived from one optical antenna assembly to another location. One signal processing technique that is particularly applicable is conversion between the time domain and the frequency domain. For example, the detected intensity values for a receiving optical antenna assembly can be sampled, and the quantized sampled values converted, such as with a Fourier Transform or Fast-Fourier Transform filter to obtain frequency domain information that is representative of the light received at all of the optical antenna elements across the receiving optical antenna assembly. This frequency domain information can be processed, stored, or transferred to a different location depending upon the desired use of the receiving optical antenna assembly.

An inverse operation can generate a desired light signal or image with the transmitting optical antenna assembly applies frequency domain information to such a device, such that the device selectively emits the equivalent of a spatial Fourier transform of an intended image. As is known, a conventional lens can act as a spatial Fourier transforming device and thus can convert the waves emitted by the optical antenna assembly to a "real world" image represented by the information applied to the optical antenna assembly.

Figure 19:
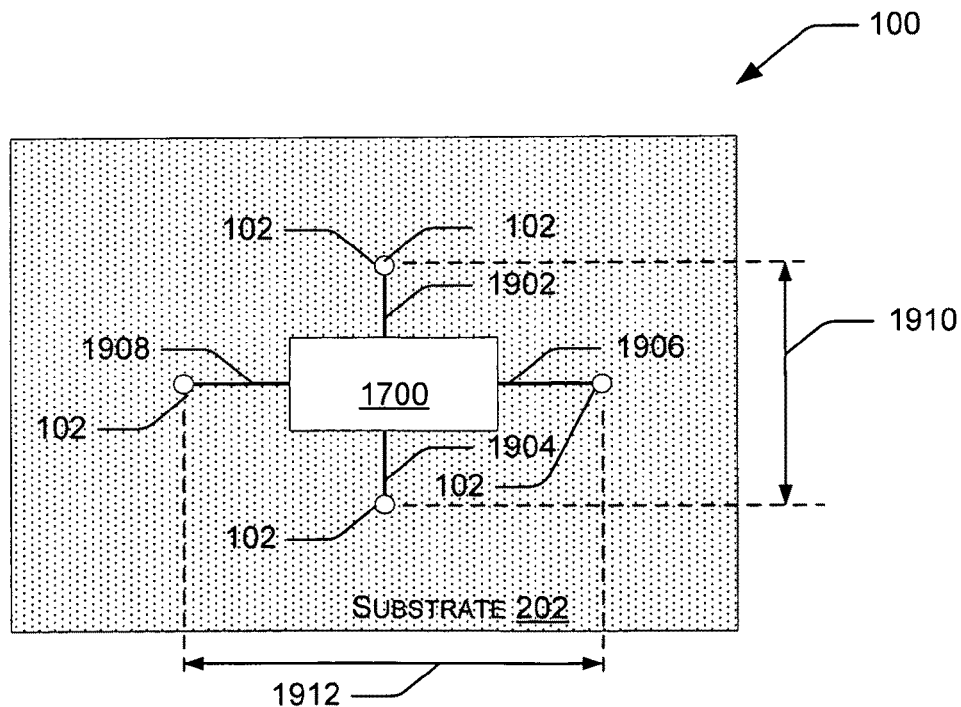

In one embodiment, the optical antenna controller 1700 as described with respect to FIG. 19 may generate the spatial frequency domain information to be applied to the optical antenna assembly, from conversion of a real world image, from an analytical source, such as optical design, modeling, or analysis software, or from information supplied from another source.

Examples of Oscillators

In many embodiments of the generating optical antenna assemblies that generate light as described with respect to FIG. 2, electrical circuitry may generate a carrier signal (either an electrical or optical signal) that is used to produce the light. Many embodiments of an oscillator may be used to produce a sinusoidal carrier signal and/or reference signal. Examples of oscillators operating at, or near optical frequencies can be found in J. C. Pearson, I. Mehdi, E. Schlecht, F. Maiwald, A. Maestrini, J. Gill, S. Martin, D. Pukala, J. Ward, J. Kawamura, W. R. McGrath, W. A. Hatch, D. Harding, H. G. LeDuc, J. A. Stern, B. Bumble, L. Samoska, T. Gaier, R. Ferber, D. Miller, A. Karpov, J. Zmuidzinas, T. Phillips, N. Erickson, J. Swift, Y.-H. Chung, R. Lai, and H. Wang, Proceedings SPIE, Astronomical Telescopes and Instrumentation, Waikoloa, Hi., 22-28 Aug. 2002; John Ward, Frank Maiwald, Goutam Chattopadhyay, Erich Schlecht, Alain Maestrini, John Gill, and Imran Mehdi, 1400-1900 *GHz Local Oscillators for the Herschel Space Observatory*, Proceedings, Fourteenth International Symposium on Space Terahertz Technology, pp. 94-101, Tucson, Ariz., 2003; John Ward, Goutam Chattopadhyay, Alain Maestrini, Erich Schlecht, John Gill, Hamid Javadi, David Pukala, Frank Maiwald, and Imran Mehdi, *"Tunable All-Solid-State Local Oscillators to* 1900 *GHz,"* Proceedings, Fifteenth International Symposium on Space Terahertz Technology, Amherst, Mass., 2004, each of which is incorporated herein by reference.

Figure 11:
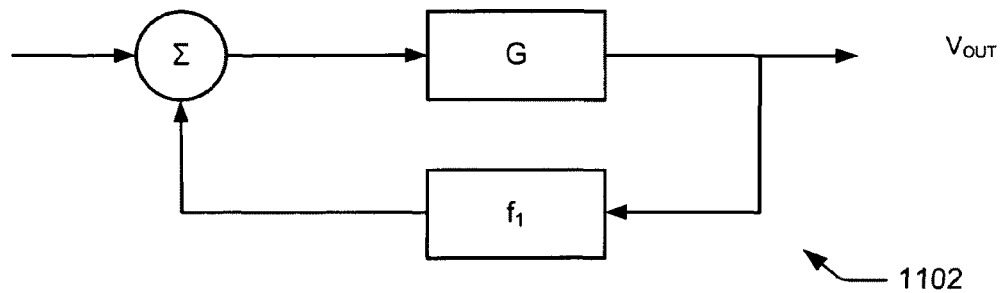
FIG. 11 is a general schematic view of one embodiment of an oscillator circuit that can be used to produce a signal.

FIG. 11 shows one generalized representation of a feedback system that may operate as an oscillator 1102. Such basic diagrammatic structures are commonly described in a variety of technologies, such as those relating to control systems, antenna systems, microwave systems, and analog circuits. Generally speaking an input signal arrives at the summer Σ where it is combined with a feedback signal from a feedback element $f_1$ to produce an combined signal that drives a gain element G. The gain element G amplifies the combined signal to produce an output signal $V_{OUT}$.

Where the loop gain is greater than unity, the system output signal will grow until some other system parameter limits the overall loop gain. Where the system is intended as an oscillator, the feedback element $f_1$ may be a frequency filter so that the overall system oscillations are sinusoidal at a selected frequency.

While one basic form of the oscillator 1102 is presented diagrammatically in FIG. 11, one skilled in the art will recognize that the actual oscillator configuration will depend upon the particular application, including frequency of operation, type of gain element, desired or available quality factor Q of various components and filters, and other operational and design considerations. For example, the frequency may be determined in part or in whole by a frequency selective component of the gain element G. Thus, references to the feedback element $f_1$ herein may be applicable to the forward gain portion of the system, in lieu of, or in addition to the feedback portion of the system.

Moreover, systems involving more than one feedback loop, systems having a separate driving source for gain, and systems having the gain and feedback portions integral to a single component may be appropriate for certain applications. Additionally, oscillators or signal sources may be presented in a variety of other diagrammatic or conceptual representational approaches.

In a general case, the oscillator output signal $V_{OUT}$ can drive one or more antenna elements described elsewhere herein. Where the output signal $V_{OUT}$ is at optical frequencies, it may provide a carrier signal, driving signal, or reference signal directly, or may be frequency converted to produce a carrier signal, reference signal, or driving signal for the optical antenna element.

Figure 12:
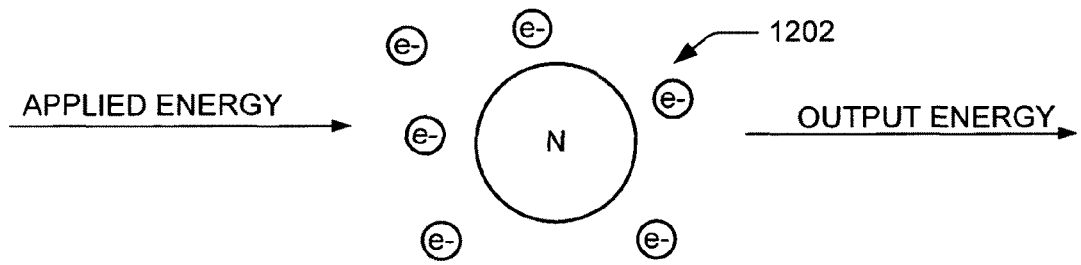
FIG. 12 is a schematic diagram of feedback element.

While the feedback element $f_1$ is represented as a basic diagrammatic block in FIG. 11, FIG. 12 shows, representationally, one type of structure 1202 that can, in part, define the system frequency of oscillation and Q. In this system, a molecule or other structure, such as a quantum dot, which may be a separate element or may be incorporated into a larger structure, such as a crystal lattice, receives input energy. The received energy may come in part from the system output, $V_{out}$ as shown in FIG. 12. The structure 1202 resonates at a frequency defined, in part, by its physical and electromagnetic characteristics, such as available quantum states of electrons or mass of molecules. One skilled in the art will recognize that FIG. 12 is merely representational of molecular structures where a nucleus N is surrounded by electrons e−. The energy levels, bond strengths, and other aspects of the molecular structure define resonances at which the molecule will naturally respond, and FIG. 12 is presented representationally for clarity of presentation. Moreover, oscillators need not rely on natural frequencies of molecules in many applications. For example, oscillators employing molecular or quantum dot based resonators have been produced at a variety of frequencies. For example, lasing based upon quantum dot oscillations is described in "*Lasing from InGaAs/GaAs quantum dots with extended wavelength and well-defined harmonic-oscillator energy levels*," G. Park, O. B. Shchekin, D. L. Huffaker, and D. G. Deppe, Applied Physics Letters Vol 73(23) pp. 3351-3353. Dec. 7, 1998.

In some implementations, the feedback element $f_1$ may include a plurality of separate or integral structures, components, or elements that provide feedback and/or frequency selectivity. As noted previously, such structures may be in the feedback portion of the system, in the forward gain portion of the system, or in both.

While the description of FIG. 11 presents the oscillator, other sources of a carrier signal, reference signal, or driving signal may be appropriate in many cases. For example, one embodiment of a system that mixes the reference signal with a received signal employs a separately generated reference signal at the optical frequency. In one approach, a laser, such as a microlaser, laser diode, dye laser, or other type of known laser produces the reference signal.

In such systems, the output signal is typically an optical beam, at a frequency on the order of tens to hundreds of terahertz. The type of lasers selected may depend upon the desired wavelength, power, cost, portability or other aspects.

In one configuration, the signal from the reference source is directed toward one or more of the optical antenna elements 102. As described previously, the optical antenna elements convert energy in the incident reference beam into a reference electrical signal carried by a portion of the optical antenna element 102.

The signal from the reference source may be applied to the same optical element that is operating as a receiving optical antenna element to produce a response in the optical antenna element 102 that is a composite of the response corresponding to the received optical signal and the response corresponding to the reference optical signal. An example of a reference optical signal mixed with a second signal to drive a dipole antenna is described in the article I. C. Mayorga, M. Mikulics; M. Marso; P. Kordos; A. Malcoci; A. Stoer; D. Jaeger; R. Gusten; "*THz Photonic Local Oscillators*"; September 2003; Max-Planck-Institute for Radioastronomy, which is incorporated herein by reference, and as obtained from the site: http://damir.iem.csic.es/workshop/files/03092003_17h50_Camara.pdf.

Figure 13:
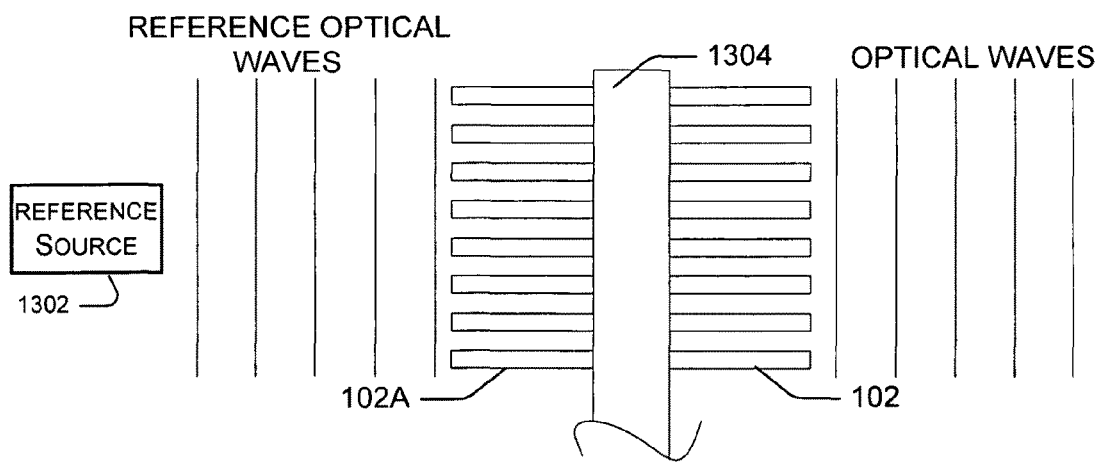
FIG. 13 is a diagrammatic representation of a portion of an optical antenna assembly having separate optical antenna elements positioned to receive a reference signal.

Alternatively, as shown in FIG. 13, the signal from a reference source 1302 may be applied to optical antenna elements 102A different from the optical antenna elements 102 operating as receiving optical antenna elements. The electrical signal corresponding to the received optical signal, and the electrical signal corresponding to the reference optical signal, can then both be coupled to an electrical conductor 1304, such as a waveguide, component, or polariton propagating material, that produces an output that is a composite of the electrical signal. Such an approach may be applicable in a variety of other physical configurations, and may be complementary to the approaches described below with reference to FIGS. 15 and 16.

In another alternative approach, a reference signal may be formed according to optical irradiation of semiconductor or nonlinear optical materials that, in turn, produce polariton propagation as can be found in N. Stoyanov, D. Ward, T. Feurer, K. Nelson; "*Terahertz polariton propagation in patterned materials*"; Nature Materials-Letters; October 2002; pp. 95-98; Volume 1; Nature Publishing Group, which is incorporated herein by reference. In such an approach, generated polaritons arriving at an optical antenna element or at an electronic component provide a phase reference for electrical signals produced by the optical antenna element.

Examples of Phase Comparators

Figure 14:
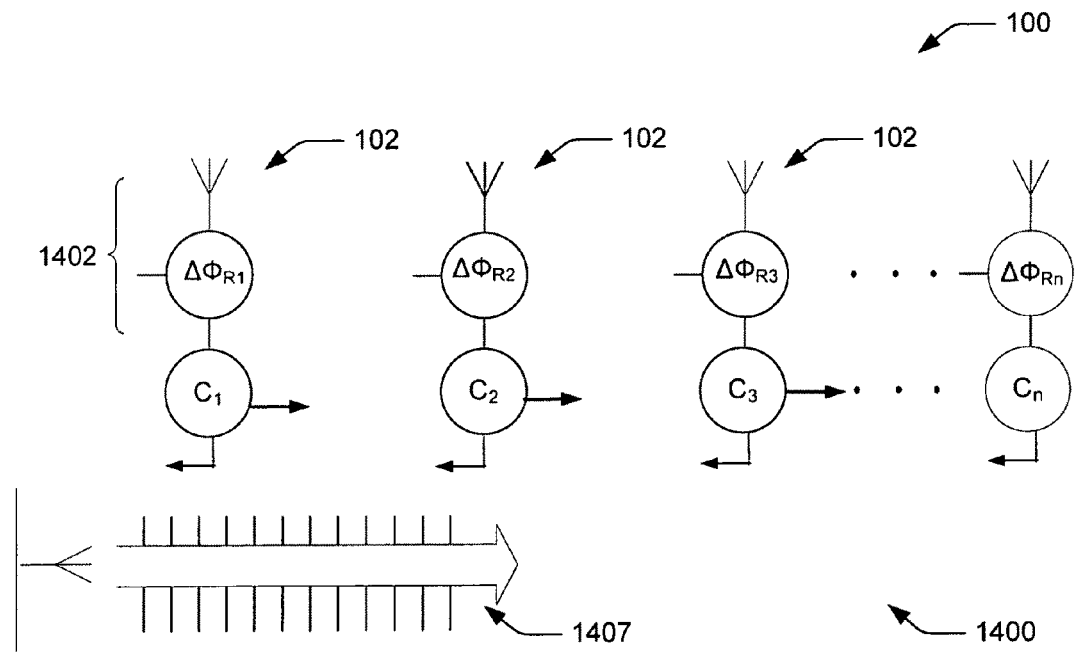
FIG. 14 is a schematic diagram of one embodiment of an array of receiving optical antenna elements.

FIG. 14 shows diagrammatically one embodiment of a phase comparator 1400 that includes a combined optical antenna element array 1402 and a reference waveform generator 1404 that produces a reference waveform 1407, presented as traveling left to right in FIG. 14. One skilled in the art will recognize that the diagrammatically represented components may form a portion of an optical antenna assembly, as described hereinabove. Each optical antenna element 102 in the array may generate and/or receive any given phase with respect to the other optical antenna element in any desired spatial location. Control of the relative phases between the optical antenna elements can allow beamforming, gain control, or other features, as described previously.

In a receiving configuration, as illustrated in FIG. 14, the combined optical antenna element array 1402 includes a number of receiving optical antenna elements 102 and corresponding comparators $C_X$ (where X=1, 2, 3, . . . , n). Each comparator $C_X$ also receives the reference waveform 1407 at a respective relative phase. In the receiving configuration, the comparator $C_X$ compares the phase of the signal received by the optical antenna element 102 relative to the reference waveform 1407 to determine the relative phase of the receive signals at each optical antenna element 102.

Where the direction of field of interest is to be controlled, the comparators $C_X$ may include respective phase adjusters $\Delta\phi_X$, that shift the phases of the corresponding signals received by their respective optical antenna elements. One skilled in the art will recognize that the same basic structure may be applied to a transmitting or generating embodiment, where combiners would be incorporated instead of the comparators. Moreover, the representation of FIG. 14 is diagrammatic and some of the aspects presented separately or as integral in FIG. 14 may be realized in one or more components in some configurations. For example, the phase comparator may be integral to the optical antenna elements or combiners in some configurations and the phase adjusters may be integrated into a single component or a few components that may be separate from the combiners. Moreover, the comparators or phase adjusters may be active or passive structures.

Additionally, the relative positions and/or orientations of the devices or components may be changed or even reversed depending upon the selected system architecture. For example, the phase adjusters may be positioned to control the phase of the reference signal in a receiving configuration or may be positioned to adjust the phase of the generated signals after the signals can be emitted by their respective optical antenna elements.

With the embodiment of the reference planar waveform generator 1404 as described with respect to FIG. 14, the reference waveform arrives from a direction substantially parallel to a plane containing the array of the optical antenna elements (e.g., from left to right in FIG. 14) such that each of the optical antenna elements receives the reference planar waveform at a respective relative time. In such configurations where the reference waveform travels in, or at an angle non-orthogonal to, a plane containing or parallel to the optical antenna elements as represented in FIG. 14, the relative time difference will be, at least in part, a function of the interelement spacing and the propagation velocity of the reference waveform.

Figure 15:
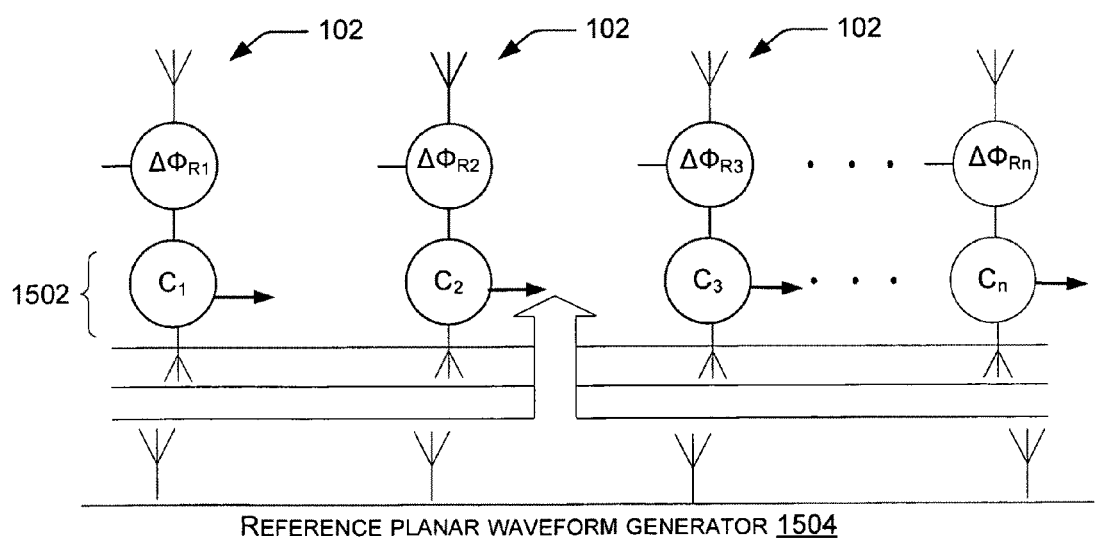
FIG. 15 is a schematic diagram of one embodiment of an array of generating optical antenna elements.

In the configuration of FIG. 15, the reference wave arrives at all of the optical antenna elements or combiners 1502 substantially simultaneously. Here, the reference waveform is presented as traveling parallel to the central direction of the generated or received waveform, though other orientations may be selected depending upon design considerations. The applied reference waveform therefore moves in a generally upward direction as illustrated with respect to FIG. 15. In this representation, the reference waveform thus arrives orthogonally relative to the plane containing the optical antenna elements. Angles other than parallel or orthogonal to the plane containing the optical antenna elements may also be selected. One approach to providing the reference waveform was described above with reference to FIG. 13, although the reference waveform may be a signal carried along a conductor, such as a wave of polaritons having defined relative phases. Such waves have been presented and imaged in the literature, e.g., David W. Ward, Eric Statz, Jaime D. Beers, Nikolay Stoyanov, Thomas Feurer, Ryan M. Roth, Richard M. Osgood, and Keith A. Nelson, "*Phonon-Polariton Propagation, Guidance, and Control in Bulk and Patterned Thin Film Ferroelectric Crystals*," in *Ferroelectric Thin Films XII: MRS Symposium Proceedings*, Vol. 797, edited by A. Kingon, S. Hoffmann-Eifert, I. P. Koutsaroff, H. Funakubo, and V. Joshi (Materials Research Society, Pittsburgh, Pa., 2003), pp. W5.9.1-6.

Also, although the reference above has been to a plane containing the optical antenna elements, other non-planar structures, including curved, layered, or other configurations may be selected. In each of these configurations, one or more reference signals may be supplied to the optical antenna elements. Further, although FIG. 14 presents the reference signal as arriving from a direction perpendicular to a plane containing the optical antenna elements and FIG. 15 shows the reference signal as arriving from "behind" the optical antenna elements, in some approaches the reference signal may arrive from the "front" of the optical antenna elements. That is, the reference signal and the generated or received signal may arrive or depart from the same general side of the optical antenna assembly. Moreover, other embodiments may employ more than one reference signal and may employ combinations of reference signals.

Additionally, the reference waveform need not be a planar waveform, or even a substantially planar waveform. For example, non-planar waveforms may be desirable in some applications. One relatively straightforward approach to producing a non-planar reference waveform is to insert a non-uniform phase delay structure, such as a non-uniform phase plate or an active array of phase delay structures between the reference waveform generator 1404. Where the optical antenna element array 1402 is configured as an optical receiver, signals from the reference planar waveform generator 1404 received at different times (and as such, signals received in different phases) among the different optical antenna elements, may be monitored and adjusted, or otherwise considered. As an example, assume that the phase of a signal generated or received at a first optical antenna element 102 relative to the reference signal differs from the phase of a signal a second optical antenna element 102.

Where the reference waveform is formed from polaritons, the reference waveform may be a composite formed from a set of polariton generators, such as a set of emissive structures or a set of apertures in a material.

In one embodiment, the phase adjusters $\Delta\phi_R$ can be controlled by an electronic controller to include, e.g., a general-purpose computer, a microcontroller, a microprocessor, an application-specific integrated circuit, or any other type of computer-based, logic-based, mechanical controller, electro-mechanical controller, or other type of a controller. The controller can optionally have input from the user to control the beamforming, beam steering, or other operations. Phase adjusting of signals may be accomplished according to a variety of known techniques that may be adapted to the frequencies herein. In a straightforward case, a fixed phase mask may be defined to provide a passive form of phase control. One such approach to phase control is described in "*Coherent optical control over collective vibrations traveling at light-like speeds*," R. M. Koehl and K. A. Nelson, J. Chem. Phys. 114, 1443-1446 (2001); "*Spatiotemporal coherent control of lattice vibrational waves*," T. Feurer, J. C. Vaughan, and K. A. Nelson, Science, 299 374-377 (2003); and "*Typesetting of terahertz waveforms*," T. Feurer, J. C. Vaughan, T. Hornung, and K. A. Nelson, Opt. Lett. 29, 1802-1804 (2004), each of which is incorporated herein by reference.

In such a circumstance, the phase adjusters $\Delta\phi_R$ of at least one of the two optical antenna elements 102 can be adjusted to reduce, eliminate, or otherwise control the in relative phases. The amount, direction, and other aspect of the relative phases can be determined according to the desired response of the antenna assembly 100. For example, pairs of elements may be excited and the relative minima and maxima of their farfield patterns may be determined. Alternatively, the general gain of the optical antenna elements along paths may be monitored and the relative phases of one, two, or more of the optical antenna elements adjusted according to an intelligent searching approach to establish the beam pattern according to a determined set of criteria (e.g., side lobe levels, central lobe gain, or similar criteria.).

Figure 16:
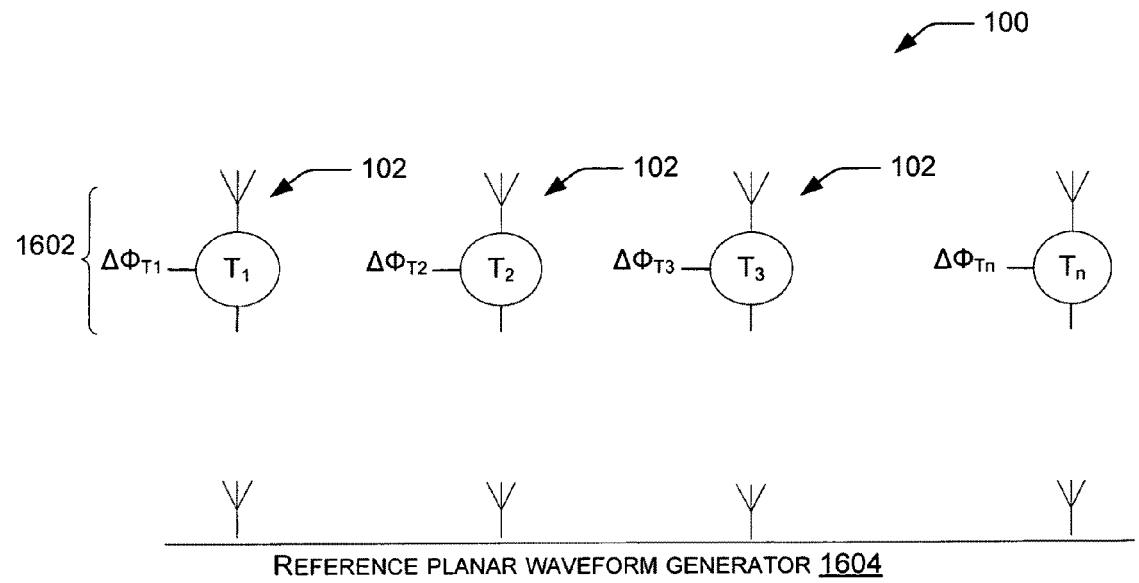
FIG. 16 is a schematic diagram of another embodiment of optical antenna elements, including a reference planar waveform generator.
Figure 17:
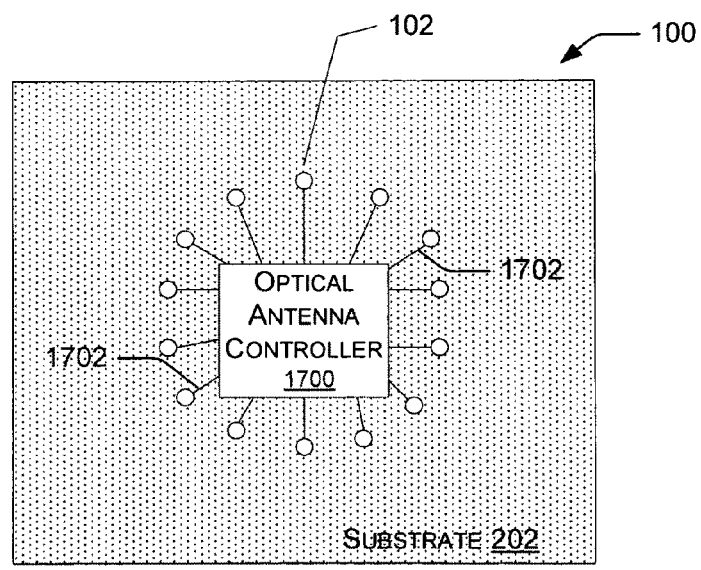
FIG. 17 is a top view of one embodiment of an optical antenna assembly.

FIG. 16 shows another embodiment of phase comparator 1600 that compares, and adjusts, the phase of a reference signal that is generated by multiple receiving optical antenna elements (instead of a reference signal being received as in the embodiment of FIGS. 14 and 15). The relative phases of the relative optical antenna elements 102 can be adjusted by adjusting the respective phase adjusters $\Delta\phi_T$. The phase comparator 1600 of FIG. 16 differs from the phase comparator 1400 of FIG. 14 in that the reference planar waveform generator 1604 is configured to apply a reference wave that is perpendicular to the orientation of the optical antenna elements of the combined generating visible frequency element array 1602. As such, the reference waves can be received at each of the multiple receiving optical antenna elements 102 at a different time corresponding to the time necessary for the reference wave to travel to each respective optical antenna element from a preceding optical antenna element.

Examples of Regular Configurations of Optical Antenna Elements

Optical antenna elements may be fabricated according to a variety of techniques including, but are not limited to, photolithography, lithography, nano structure growth, and attaching separately grown nano structures a substrate or other support. Optical antenna elements may be classified as either regular or non-regular. As described above, with an this disclosure, the term "uniform", pertains to regular or statistically regular arrays of optical antenna elements that extend substantially continuously across a portion of, or an entirety of, an optical antenna assembly.

Figure 22:
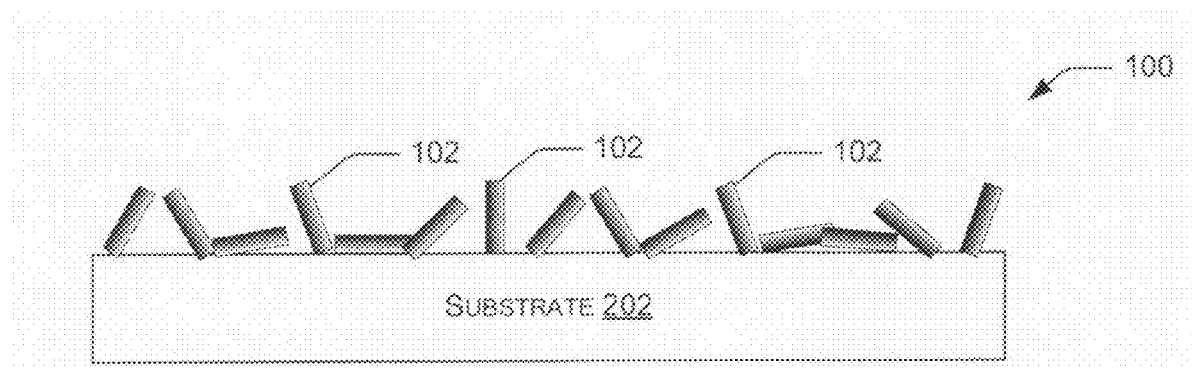
FIG. 22 is a diagrammatic representation of one embodiment of optical antenna element arrangements.

Conceptually, perhaps one easy configuration of optical antenna elements to consider are those in which each optical antenna elements are uniformly spaced from the neighboring optical antenna element, and each optical antenna element extends substantially perpendicular to the substrate or other supporting member. As the dimensions of each optical antenna element are typically minute spacing of the optical antenna elements may not be exactly regular. Additionally, it might be difficult in many embodiments to ensure that the optical antenna elements extend substantially perpendicular to the substrate or supporting member. As such, the term "regular" pertains in many embodiments to the location of attachment of the optical antenna elements across the substrate. For example, growing optical antenna elements from a number of regularly spaced seed locations can produce a substantially regular array of optical antenna elements within an optical antenna assembly, even though many of the optical antenna elements may extend at angles other than orthogonal with respect to the substrate, as represented in FIG. 22. For a large number of the optical antenna elements and a limited range or appropriate distribution of angles at which the optical antenna elements extend from the supporting structure, the overall resulting operating characteristics of many embodiments of the optical antenna assembly may have substantially repeatable, predictable and/or determinable electromagnetic characteristics.

A large number of other fabrication techniques can be used to produce regular arrays of optical antenna elements. For example, lithographic patterning techniques, e-beam lithography, and nano structure epitaxial growth can be utilized. Grown nanostructures can be separated, and reattached to the supporting member to produce a statistically regular configuration of the optical antenna elements.

Figure 23:
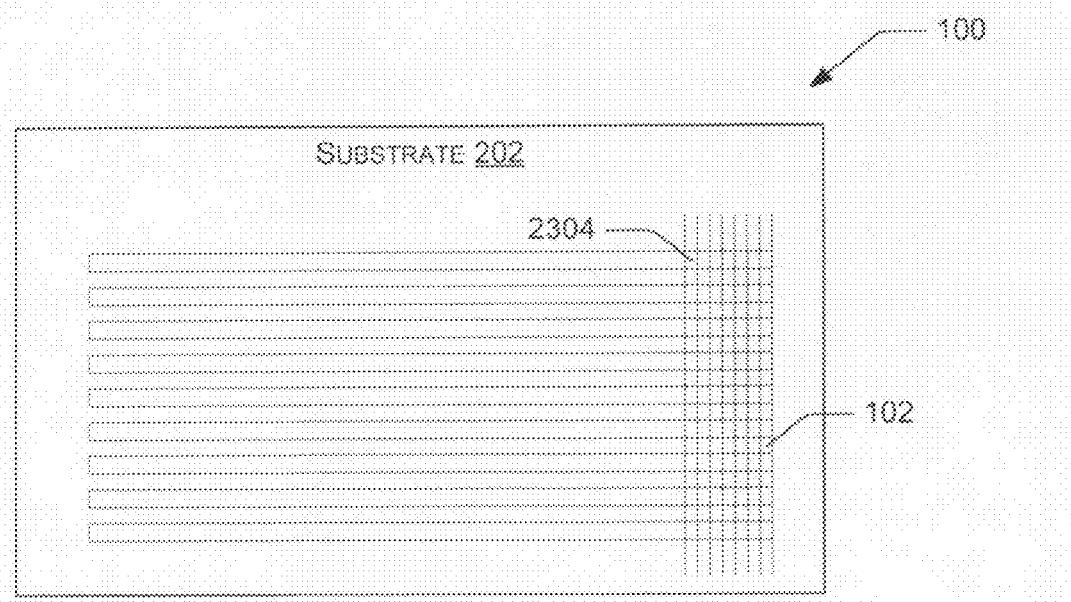
FIG. 23 is a schematic diagram of one embodiment of an arrangement of optical antenna elements according to grid.

Another embodiment of regular optical antenna assembly is represented in FIG. 23, in which a number of patterned rectangles 2304 are formed in a substantially horizontal configuration across the substrate or supporting member. The patterned rectangles 2304 may be formed in one embodiment using lithography, photolithography, or some other etching, growth or other fabrication technique.

The spacing and dimensions of the patterned rectangles is selected to correspond to the intended operational frequency of the optical antenna elements. Typical photoconductor or processing techniques can be used to produce the structures, as are generally known by those skilled in the art of semiconductor processing.

Although the embodiment of FIG. 23 includes rectangular optical antenna elements 2304, a variety of other structures, including those having hexagonal, circular, elliptical, or other cross-sections may be appropriate for some configurations. Moreover, although the optical antenna elements 2304 are represented as structures that extend from a base, other structures, such as recesses, apertures, or voids or structures that extend laterally or in other directions may be suitable.

Examples of Applications in Systems

This disclosure now provides a number of different embodiments of a plurality of optical antenna elements 102 that can be configured in an array. A number of embodiments of optical antenna assemblies may be operable to produce waves appropriate for interferometric applications.

Interferometric applications, including interferometer-based optical imaging or measurement, include telescopes, including those that have allowed astronomers to measure the diameter of stars, distance measuring, photolithographic applications, surface topology, speed measurement, surface topology measurements, distance measurements, and a variety of other applications. The configurations of such interferometers can apply similar principles to those described with respect to FIGS. 6 and 7.

In addition to general measurement applications, coherent techniques can be configured to provide a variety of embodiments of a holographic projector, as described below, including holographic devices for image presentation. One embodiment of optical interferometers described with respect to this disclosure includes solid state interferometers. Such solid-state optical-domain interferometers operate by mixing the received light, and extracting phase information from the mixed signal without leaving the optical domain. One aspect of certain embodiments of the optical interferometers can be characterized as operating as "digital interferometers." In one approach a digital optical interferometers includes a digital computation device that selectively controls the amplitude and/or phase of a number of the optical antenna elements. The selected relative phase and/or amplitude may be determined analytically, through calculations or other approaches, may be determined empirically, or may be retrieved from memory. In one embodiment, solid state optical-domain interferometers can be microelectromechanical system (MEMS) based. In another embodiment, such solid state optical-domain interferometers can be configured to operate relying upon non-MEMS optical switching techniques.

A variety of approaches to preparing or producing data to store in memory or to provide to the computation device may be appropriate. In one application, the data is generated by capturing an image, including phase information with an optical antenna assembly-based device or other type of holographic device.

A variety of numerical techniques, such as those known for conventional phased arrays and holographic techniques, may be applied to produce the digital data for captured, displayed, or projected images. In one approach where each optical antenna element produces a signal indicative of an arriving wave, the input is sampled, typically at a frequency approaching, substantially equaling, or exceeding the frequency of the received light, and the sampled data is processed digitally. Computer techniques and hardware continue to increase processing speeds to further improve the accuracy and performance of the digital imaging.

In some applications, the data or information may be captured at a first location, or set of locations, and then propagated to a second location where an image is presented, as a display or holographically presented image. Moreover, the data or information to be generated may be compressed or replaced or supplemented by representative data to increase the speed or reduce system burden for information transmission.

The number, arrangement, location, material, and other properties of the optical antenna elements may vary greatly depending upon the particular design considerations. However, as an exemplary embodiment of an application that may utilize coherent imaging or interferometric approaches, a receiving optical antenna assembly may operate similarly to a miniaturized so-called Keck telescope or a very large array (VLA) radio telescope employing waves at optical frequencies.

Certain techniques described herein, relating to interferometers, can also be applied to design and construct cameras that can be configured as detectors, as described above. The basic interferometer approach could therefore be applied to detectors formed from a regular or non-regular array of optical antenna elements or sets of arrays of optical antenna elements. Depending upon various design considerations, the dimensions of the array may range from postage stamp size to billboard size, and even outside of these dimensions. At some physical optical antenna element dimension, the optical antenna elements of the optical antenna assembly can be fabricated to be self-supporting, and it may be appropriate to fabricate the substrate separately from the optical antenna elements. In other embodiments, the optical antenna elements can be supported separately from a substrate or set of substrates.

One embodiment of the receiving optical antenna assembly can be configured to form one embodiment of an extremely "thin" imager. In such an approach, the operational circuitry can be disposed in a separate structure or may have integrated operational circuitry. In one application, the imager may be configured as a portion of a camera that may allow the camera to have features different from conventional cameras. In one approach, additional portions of the optical antenna assembly, such as a phase control assembly can provide directionality or gain that can supplement or replace some portion of the conventional focusing optics in a camera. In some applications, the imager functionality may be sufficient to completely replace the conventional optics. In other applications, the imager functionality may incorporate a combination of conventional optics and an array of optical antenna elements.

Where the optical antenna assembly is used without separate discrete optics or is configured with microoptics, the optical antenna-based camera can be configured with a thickness corresponding to the thickness of a semiconductor-based chip integrated into the camera (e.g., having dimension on the order of one or a few mm), and depending upon the application may have an acceptable effective aperture size, focal length or other properties.

In one embodiment, as described above, digital sampling provides an effective Fourier Transform by controlling/activating selected elements or phase controls. This may allow for a self-correlating optical imaging device. While above descriptions include periodically spaced arrays of elements, other configurations may be selected. In one embodiment, one or more optical antenna elements 102 form an annular ring on a substrate 202 as presented diagrammatically below with respect to FIG. 17.

This configuration including phasel taps 1702 provides a discrete set of phase directions that can adjust the relative phase. This can be viewed as a phase scanning version of pixels. The set of taps in effect defines the "phasels" that mix light from various parts of the ring of optical antenna elements. The number and spacing of the phasels determine the angular resolution, in part.

One such embodiment of electrical domain interferometer can be implemented using certain digital approaches. For example in one aspect, phasel taps can be configured as the φ-adjusts that rely upon delay lines whose delay time can be individually modified. Another approach to phase control involves physically modifying the relative positions or dimensions of the optical antenna elements 102.

Yet another aspect of the φ-adjusts 104 includes approaches that control relative signal delays with something other than physical length (e.g., altering material properties, constructing waveguides with reduced propagation velocities, etc.). An example of such analysis in the microwave range that would be substantially directly applicable to the optical antenna assembly is described in Chiang, et al., *Microwave Phase Conjugation Using Antenna Arrays*, IEEE Transactions on Microwave Theory and Techniques, Vol. 46, No. 11 (November 1998), which gives examples of analyses of 8-element and 40-element microwave antenna arrays, and which is incorporated herein by reference. While such design or control may be performed analytically, empirical or statistical approaches may also be applicable. For example, statistical approaches to beam forming or directional determination may be applied to the optical antenna assembly.

Another embodiment of an optical antenna assembly-based device employs scanning techniques. In one embodiment, an image is displayed or captured by scanning and controlling a pixel by pixel basis. Scanning may be by a physical device, such as a MEMS, acoustooptic, or similar scanner, may be implemented by controlling phase and amplitude of the signals at each respective optical antenna element, or may be a combination of both.

Many signal switching or modulation techniques can provide selectivity of signals from respective ones or groups of optical antenna elements. For example, one exemplary approach applies interference of signals, with a structure such as a Mach-Zender interferometer to selectively transmit some or all of the signal from respective optical antenna elements to the respective desired locations.

In a simplistic example of interference according to the structure of FIG. 13, energy is traveling, for example, from the left optical antenna element 102A (left to right) mixes with a signal from the right optical antenna element 102. If the signals have the same amplitude and are a half wavelength out of phase at a given location, to a first order, the net signal at the location will be substantially zero. The amplitude will vary depending upon the amplitude of the received signal relative to the amplitude of the reference signal, and/or the relative phases of the signals.

Rather than attempting to detect in all directions from a set optical antenna elements positioned within one plane, it may be desired in some embodiments of the optical antenna assembly, to use a plurality of antenna assemblies, each having a respective field of regard. Each of the antenna assemblies may have a fixed field of regard, or may be scannable. Moreover, the respective fields of regard may be non-overlapping or partially overlapping.

Where the fields of regard are separate, it may be advantageous to vary the relative phases within a smaller range as compared to the phase ranges corresponding to addressing a larger field of regard. Directing respective optical antenna assemblies at respective orientations can allow an overall system to monitor a wide range of fields of view or to emit light over a relatively wide range. In some cases, the size of the arrays of optical antenna elements may allow a plurality of arrays to be assembled in a single unit or a few units. This may enable a compact system with a relatively large field of view.

Consider a 2D array of the phasel taps that can be configured, in the embodiment as described with respect to FIGS. 1 and 2, as the φ-adjust 104. The combiner 106, as described with respect to FIG. 1, is configured to mix the input from any group of optical antenna elements having the desired combination of phase delays between a minimum value and a maximum value.

One relatively simple approach to increasing the response speed of the phasel taps (e.g., the φ-adjust 104) includes providing each of the phasel taps with a set of discrete phase delays, each corresponding to respective a substantially fixed angular increment or relative phases. The relative phases between respective optical antenna elements 102 can be adjusted by selectively coupling one or more of the discrete phase delays.

After signals from a plurality of the receiving optical antenna elements 102 are down-converted (e.g., by mixing), the output down-converted signal is then processed with appropriate electronic circuitry. In one approach, the electronic circuitry includes an analog-to-digital (A/D) converter that produces a digital signal representative of the downconverted signal. While the described implementation employs electronic circuitry including the A/D converter, a variety of other approaches to processing or otherwise handling downconverted signals may be appropriate, including analog filtering, sampling, or other known approaches.

Examples of Configurations of Regular and Non-Regular Arrays of Optical Antenna Elements In many embodiments of the optical antenna assembly, an array of optical antenna elements may be arranged in a pattern other than an N×N matrix where each location includes one or more antenna elements. One example described previously is the ring arrangement of FIG. 17.

In another arrangement, a set of antenna elements may be arranged according to an N×N matrix of positions, with one or more of the positions in the matrix being empty. In some cases, a substantial portion, which may be more than half of the positions, may be empty. The positioning, response, design and other features of such a design may be determined according to techniques for sparse-array antenna structures. Examples of such analyses may be found, for example, in Athley *Optimization of Element Position for Direction Finding with Sparse Arrays*, self-identified as published at IEEE Proceedings of the 11$^{th}$ Workshop on Statistical Signal Processing, Aug. 6-8, 2001 (Singapore).

A less than full (two-dimensional) array of optical antenna elements may simplify fabrication and computation in some applications, while providing substantially the same information as a full array of optical antenna elements. A more sparsely populated array may address substantially the same field of view and acquire substantially the same information by sequentially addressing a set of fields of view. In one approach such an array includes a set of associated φ-adjusts 104 configured as phasel taps, or individually-controllable delay lines, as described with respect to FIGS. 1 and 2. The output from the different relatively few sets of the optical antenna elements can be combined to produce a set of information that approximates that of a more densely populated array.

A number of embodiments of the optical antenna assembly may include arrays of optical antenna elements that have periodic or aperiodic spacing of the optical antenna elements. Selection of periodic or aperiodic spacing, the inter-element spacings, or the selection of patterns may depend in part upon the shape, sidelobes, gain, complexity, or other design considerations. For example, in some approaches gain or antenna beam pattern may be directed toward high directionality to allow communication between two locations at relatively low power. This may reduce the likelihood of third party detection or reduce power consumption in some applications.

For example, in one embodiment of the receiving optical antenna assembly, optical antenna elements may be formed directly atop a semiconductor wafer. In one approach, a portion of the electronic circuitry or portions of the antenna assembly may be formed integral to the semiconductor wafer.

In one embodiment, a plurality of optical antenna elements may be are arranged to form a pattern that is generally in the shape of an annular ring, which may be generally circular or another shape. In one embodiment, the annular ring generally follows the periphery of at least a portion of the chip. In such a configuration some portion of the control circuitry or other portions of the antenna assembly, such as phase adjusters, mixers, or combiners, that is associated with the antenna elements is partially or wholly surrounded by the annular ring. The effective diameter or other cross sectional dimension of the annular ring thereby defines the effective aperture of the optical antenna elements.

Regularly shaped arrays are not limited to N×N squares or M×N or N×N rectangular arrangements. Moreover, the arrangements are not limited to circular rings, squares, or rectangles. A variety of arrangements may be developed according to antenna design principles in a variety of two-dimensional or three dimensional configurations.

For example, certain embodiments of patterns of optical antenna assemblies include, but are not limited to, sets of optical antenna elements as arranged as an extended dipole, a sinusoidal shape, a repeatable curve, annular rings, or other mathematically or otherwise analytically definable arrays.

Other embodiments of optical antenna assembly configurations include, but are not limited to, non-repeatable curves, portions of the optical antenna assembly formed on different layers, portions of the optical at the assembly at different elevations (e.g., on a non-level layer), curved or U-shaped structures, discontinuous portions of optical antenna assemblies that form capacitive, inductive, or matching structures, etc.

Moreover, the optical antenna elements are not necessarily limited to positioning on a single level and patterns may subtend more than one level. For example, the optical antenna elements may be arranged on different layers of substrate or may be distributed irregularly in depth.

As described previously, FIG. 17 shows one example of an array of optical antenna elements 102 arranged in non-regular pattern. The number of optical antenna elements forming the ring may range from one pair to a large number (tens, hundreds, thousands, or more), depending upon various design considerations, such as power, resolution, cost, size, manufacturability, or other factors. The layouts of the optical antenna elements 102 as described with respect to FIGS. 17 to 19 may be intended to be configured as either receiving or generating optical antenna elements or element that may both generate and receive, as described with respect to FIGS. 1 and 2.

The diameter of the ring approximates the effective aperture of each optical antenna assembly 100. Circuitry or other elements may be located adjacent to or integral with the respective optical antenna elements in some configurations. However, in the approach presented in FIG. 17, delay lines (phasel taps) 1702 link optical antenna elements to an optical antenna controller 1700. In this embodiment, optical antenna elements that are oppositely positioned utilize respective pairs of delay lines 1702, though other arrangements may be selected. The delay lines may be fixed or may have variable delays. In one approach to variable delay, as presented in this embodiment, each delay line has one or more phasel taps (e.g., the φ-adjust 104 as described with respect to FIGS. 1 and 2) that can be switched on or off under control of the central circuitry or under other control.

The operation of the optical antenna assembly 100 is controlled by the optical antenna controller 1700. In one embodiment, each opposed pair of optical antenna elements can be operated in tandem. The optical antenna controller 1700 can operate using as many pairs of optical antenna elements 102 as are desired, from one pair to the number of pairs of optical antenna elements that can be present in the optical antenna assembly 100.

Figure 18:
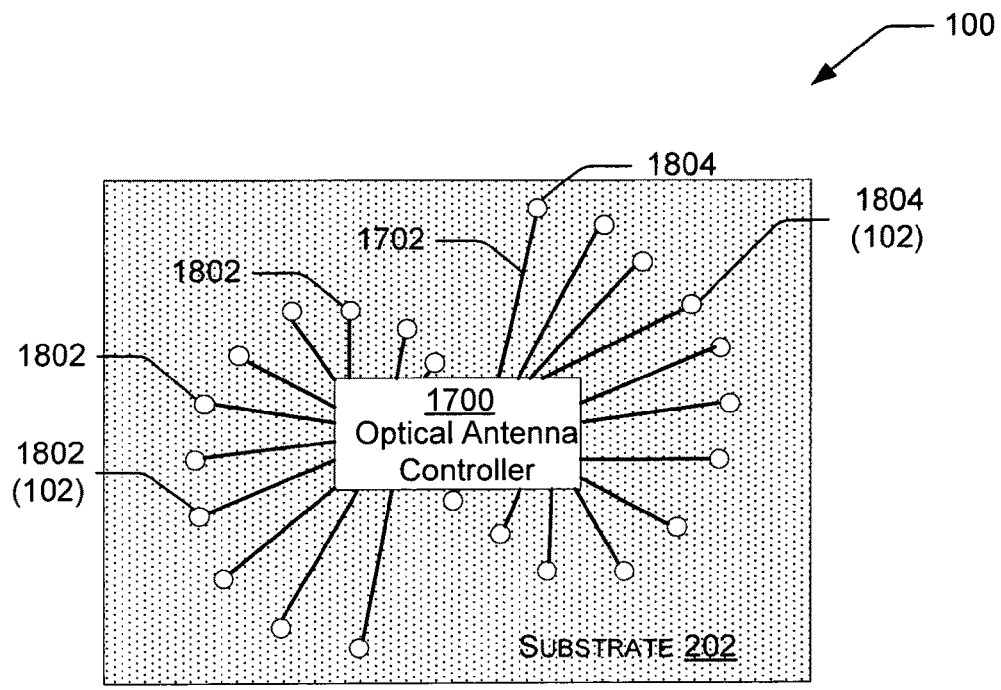
FIG. 18 is a top view of yet another embodiment of an optical antenna assembly.

FIG. 18 illustrates another embodiment of the optical antenna assembly 100 that includes another non-regular pattern of optical antenna elements 102 in two generally spiral-shaped patterns 1802, 1804. Each optical antenna element 102 in each spiral-shaped pattern has a respective distance from a geometric center of the pattern that increases as the distance along the spiral increases. As represented in FIG. 18, the distance to each optical antenna element generally increases as one follows each spiral-shape pattern 1802, 1804 in a counter-clockwise direction, though other spiral shapes and directions may be appropriate depending upon the configuration.

FIG. 19 illustrates yet another embodiment of the optical antenna assembly 100 that illustrates selectively using sets of antenna elements to control effective antenna aperture or other characteristics. In this example, one pair of opposed optical antenna elements 102 can be connected or operationally coupled by respective conductors 1902 and 1904 to the optical antenna controller 1700. The spacing of this first pair of opposed optical antenna elements 102 defines a first aperture spacing 1910. Another pair of opposed optical antenna elements 102 are connected or operationally coupled by respective conductors 1906 and 1908 to the optical antenna controller 1700. The spacing of the second pair of opposed optical antenna elements 102 defines a second aperture spacing 1912. The embodiment of optical antenna assembly 100 as described with respect to FIG. 19 can therefore utilize the first aperture spacing 1910 and/or the second aperture spacing 1912.

While the number of optical antenna elements, or pairs of opposing optical antenna elements, shown in the figures, is presented herein as a one or a few elements or pairs of elements, it is to be understood that the number and exact configuration of the optical antenna elements within any particular optical antenna assembly is a design choice, and variations thereof are within the intended scope of the present disclosure. In addition, other regular patterns, non-regular patterns, or mixtures thereof of optical antenna elements to form an array are within the intended scope with present disclosure.

Figure 20:
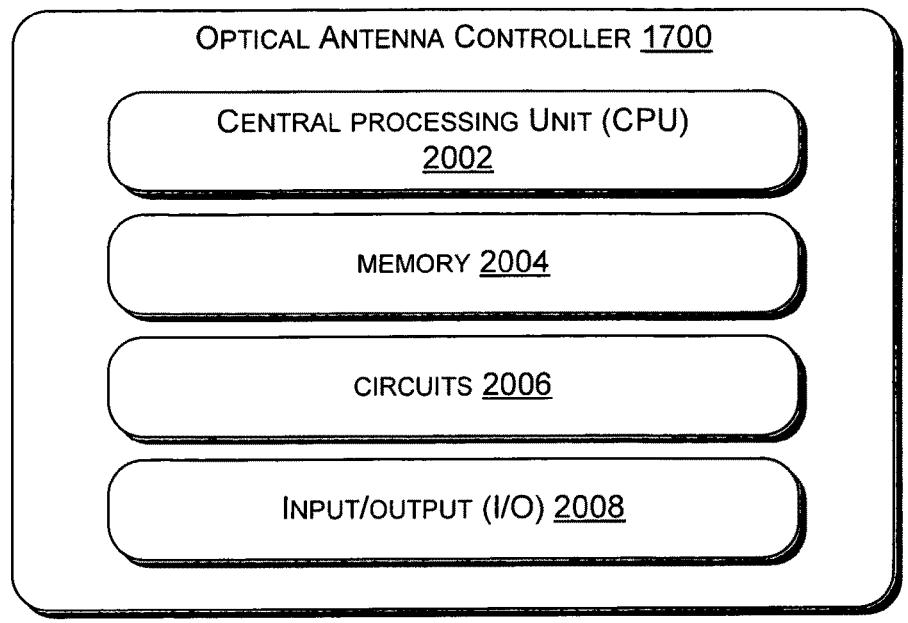
FIG. 20 is a schematic diagram of one embodiment of an optical antenna controller.

FIG. 20 shows one embodiment of the optical antenna controller 1700, as described above with respect to FIGS. 17, 18, and 19. The optical antenna controller 1700, whose components are shown in FIG. 3, comprises a central processing unit (CPU) 2002, memory 2004, circuit portion 2006, and input output interface (I/O) 2008 that may include a bus (not shown). The optical antenna controller 1700 can be a general-purpose computer, a microprocessor, a microcontroller, or any other known suitable type of computer, controller, or circuitry that can be implemented on hardware, software, and/or firmware. The CPU 2002 performs the processing and arithmetic operations for the optical antenna controller 1700. The optical antenna controller 1700 controls the signal processing, computational, timing, and other processes associated with generating or receiving light from the optical antenna assembly 100.

Certain embodiments of the memory 2004 include random access memory (RAM) and read only memory (ROM) that together store the computer programs, operands, desired waveforms, patterns of opposed optical antenna elements, operators, dimensional values, system operating temperatures and configurations, and other parameters that control the optical antenna's operation. The bus provides for digital information transmissions between CPU 2002, circuit portion 2006, memory 2004, and I/O 2008. The bus also connects I/O 2008 to the portions of the optical antenna assembly 100 that either receive digital information from, or transmit digital information to, though one or more optical antenna elements 102.

I/O 2008 provides an interface to control the transmissions of digital information between each of the components in the optical antenna controller 1700. I/O 2008 also provides an interface between the components of the optical antenna controller 1700 and different portions of the optical antenna assembly 100. The circuit portion 2006 comprises all of the other user interface devices (such as display and keyboard). In another embodiment, the optical antenna controller 1700 can be constructed as a specific-purpose computer such as an application-specific integrated circuit (ASIC), a microprocessor, a microcomputer, or the like.

In one embodiment, multiple layers of the optical antenna assembly are also provided. The layers may be substantial copies of each other or may have differing configurations, spacing, properties, or other features. In another embodiment, the effective width of the annular ring of the optical antenna elements can be adjusted by adjusting the number of active optical antenna elements that can be contained in each row, or alternatively by activating or deactivating certain ones of multiple annular rings of the optical antenna elements.

The optical antenna controller 1700, as described with respect to FIGS. 17, 18, 19, and 20 can be configured to activate or deactivate certain ones of the optical antenna elements. As such, the configuration and element density of the array of optical antenna elements 102 within the optical antenna assembly 100 can be controlled extremely quickly by some programming of the optical antenna controller 1700. Replication of certain ones of the optical antenna elements or redundancy may also provide fault tolerance, compensate for physical imperfections, reduce effects of contaminants, such as dust or dirt, add wavelength selectivity, or provide other design freedoms.

Reflective, refractive, phase delay, diffractive and/or other optical techniques may be combined with the optical antenna assembly and approaches described herein. For example, refractive lenses may be positioned to provide a curvature to waves arriving at the array of optical antenna elements or a wavelength selective filter may reduce light at certain wavelengths to augment wavelength selectivity of the optical antenna assembly.

In certain embodiments, it may be desired to provide a scratch-proof coating above one, or an array of, the optical antenna elements to protect and ensure the continued operation of the optical antenna elements. A coating of a suitable covering material such as artificial sapphire, silicon, or diamond can be deposited or otherwise positioned above a any portion of, or substantially all of, the array of optical antenna elements. In some applications, a coating, such as diamond, may be provided over both sides while providing continued optical antenna element operation. In certain embodiments, control circuitry or other circuitry may be integral to or positioned in close proximity to the antenna assembly, and subsequently protected by such coating. The concepts of the coating can be sufficiently straight-forward and self-explanatory and are not displayed in any figure.

Examples of Applications

Figure 21:
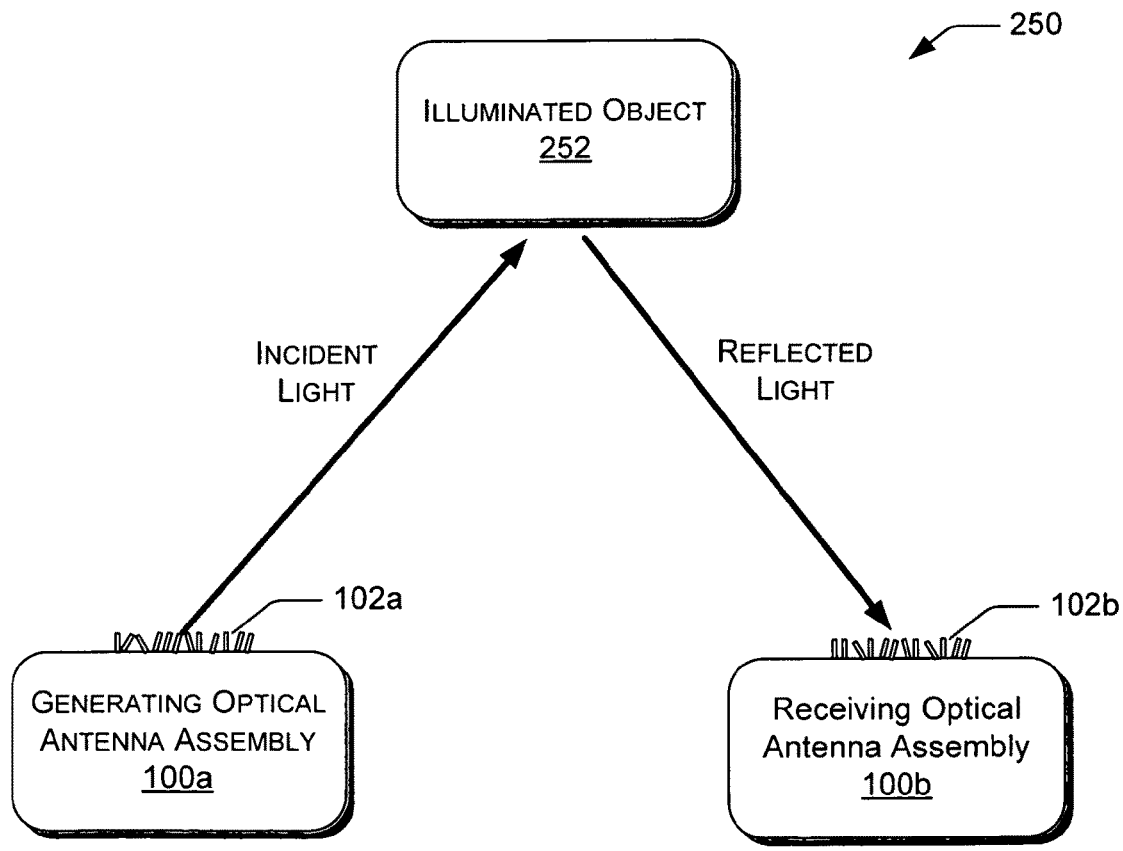
FIG. 21 is a view of one embodiment of an illumination system.

An optical system 250, shown diagrammatically in FIG. 21 includes both a generating optical antenna assembly 100a, which may be the same as that described with respect to FIG. 2, that provides illumination to an object 252. Additionally, the embodiment may include a receiving optical antenna assembly 100b, such as that described with respect to FIG. 1, that can capture light that is reflected from the surface of the illuminated object 252. As represented diagrammatically in the optical system 250, light generated from a generating optical antenna element 102a illuminates an object 252. A second optical antenna element 102b then captures a portion of light reflected from the object. One skilled in the art will recognize that the diagrammatic representation of FIG. 21 is a simplified representation of illumination and capture light from the environment and that the light striking the object will typically be a function of light emitted from more than one optical antenna element. Similarly, in some applications, each optical antenna element 102a, 102b may operate as both a signal generator and a signal receiver. The simplified representation is presented herein for clarity of presentation.

Where the generating optical antenna assembly 100a is configured to concentrate optical energy or direct optical energy toward one or more regions, as described previously, the optical antenna assembly can selectively illuminate one or more spatial locations or angular ranges. Similarly, in one embodiment, the receiving optical antenna assembly 100b can receive light selectively from one or more regions or angular ranges. In some approaches, a single optical antenna assembly may be configured to selectively direct optical energy to and receive optical energy from selected spatial locations or angular ranges.

In one embodiment, a combined illumination and reception technique using the optical antenna assemblies can be configured to operate similarly to an optical range finder or LIDAR type of system.

In some cases, the selectivity, gain, or other operational aspects may be adjusted by selective polarization or by adding additional optical structures, such as diffractive elements, lenses, or other known optical components. While the above embodiment has been described in many cases as a coherent system, in some cases, an optical antenna assembly can be adapted to operate with non-coherent or only partially coherent light energy.

Often, illumination or illuminated imaging in the optical domain is either broadband (e.g., a camera flash that outputs light to having a wide mixture of light frequencies such as white light), or narrowband (i.e. light produced with a laser that has one, or a small number of, frequencies). In one embodiment, an optical antenna assembly can be configured to provide or receive light selectively from two, three, or more wavelength bands. In one approach, the bands may be primary color bands, such as red, green, and blue wavelengths. A multiband approach, such as light of the visible and/or near-visible frequencies, can also be used in various image capture or sensing applications. In each of these approaches, the antenna element sizes, spacings, orientations, and other characteristics can be optimized according to design criteria. In some approaches, sets of antenna elements may be devoted to each wavelength range.

While much of the above discussion of exemplary embodiments has concentrated on light of visible or infrared wavelengths, many of the methods, principles, structures, and processes herein may be applied at or extended to other wavelength bands. For example, wavelengths in the far-infrared and into the millimeter wavelength range may penetrate materials to depths different from and, in some cases, greater than visible wavelengths. Such wavelength bands may be chosen for example to image objects or augment imaging of objects. In one approach, wavelengths on the order of one or a few millimeters may permit imaging at depths different from those of visible wavelengths. Similarly, as photolithographic techniques or other fabrication techniques permit, ultraviolet implementations may be realized.

CONCLUSION

While several embodiments of application for optical antenna elements have been described in this disclosure, it is emphasized that these applications are not intended to be limiting in scope. Any device or application that involves the use of the optical antenna elements, as described within this disclosure, is within the intended scope of the present disclosure.

Different embodiments of the optical antenna elements can be included in such embodiments of the communication system as telecommunication systems, computer systems, audio systems, video systems, teleconferencing systems, and/or hybrid combinations of certain ones of these systems. The embodiments of the status indicator as described with respect to this disclosure are intended to be illustrative in nature, and are not limiting its scope.

Those having skill in the art will recognize that the state of the art has progressed to the point where, in many cases, there is little distinction left between hardware, firmware, and software implementations of aspects of systems; the use of hardware, firmware, or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those skilled within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

All of the above U.S. patents, U.S. patent application publications, U.S. patent applications, foreign patents, foreign patent applications and non-patent publications referred to in this specification and/or listed in any Application Data Sheet, are incorporated herein by reference, in their entireties.

The herein described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components structure and/or wirelessly interactable and/or wirelessly interacting components or structures and/or logically interacting and/or logically interactable components or structures and/or electromagnetically interactable and/or electromagnetically interacting components or structures.

It is to be understood by those skilled in the art that, in general, that the terms used in the disclosure, including the drawings and the appended claims, are generally intended as "open" terms. For example, the term "including" should be interpreted as "including but not limited to"; the term "having" should be interpreted as "having at least"; and the term "includes" should be interpreted as "includes, but is not limited to"; etc. In this disclosure and the appended claims, the terms "a", "the", and "at least one" are intended to apply inclusively to one or a plurality of those items.

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.).

Those skilled in the art will appreciate that the herein-described specific exemplary processes and/or devices and/or technologies are representative of more general processes and/or devices and/or technologies taught elsewhere herein, such as in the claims filed herewith and/or elsewhere in the present application.

Within this disclosure, elements that perform similar functions in a similar way in different embodiments may be provided with the same or similar numerical reference characters in the figures. The above disclosure, when taken in combination with the associated figures, represents a number of embodiments of arrays of optical antenna elements included in optical antenna assemblies. Other slight modifications from these disclosed embodiments that are within the scope of the attached claims are also within the intended scope of the present invention.

The invention claimed is:

1. An optical receiving structure, comprising:
   a. a plurality of passive optical receiving sections, each shaped to produce an electromagnetic potential in response to an incoming optical wave; and
   b. a plurality of respective frequency conversion structures coupled to receive the produced electromagnetic potentials and responsive to produce a corresponding optical signal at a reduced frequency relative to a frequency of the incoming optical wave, wherein the plurality of respective frequency conversion structures includes transistors having gates coupled to the passive optical receiving sections.

2. The optical receiving structure of claim 1, wherein each of the frequency conversion structures is sized and shaped to interact at the frequency of the incoming optical wave, the optical receiving structure further including downconverting circuitry coupled to each of the frequency conversion structures and responsive to the respective localized potential to produce an optical output signal at a frequency lower than the optical frequency of the incoming optical wave.

3. The optical receiving structure of claim 2 wherein the downconverting circuitry includes a square law device.

4. The optical receiving structure of claim 3 wherein the square law device is a Schottky diode.

5. The optical receiving structure of claim 2 the downconverting circuitry includes a signal mixer.

6. The optical receiving structure of claim 5 wherein the signal mixer is an optical mixer.

7. The optical receiving structure of claim 5 wherein the signal mixer is an electronic mixer.

8. The optical receiving structure of claim 5 including a reference signal source coupled to the signal mixer.

9. The optical receiving structure of claim 2 wherein the conversion structures include a nanotube.

10. The optical receiving structure of claim 2 wherein the conversion structures include one or more regions shaped to guide plasmons.

11. The optical receiving structure of claim 10 including a reference signal source and wherein the downconverting circuitry includes a mixer coupled to the conversion structure and the reference signal source.

12. The optical receiving structure of claim 1, wherein the plurality of respective frequency conversion structures are integral to the optical receiving sections.

13. The optical receiving structure of claim 1, wherein the plurality of respective frequency conversion structures include high electron mobility nonlinear devices.

14. The optical receiving structure of claim 13 wherein the high electron mobility nonlinear devices are transistors.

* * * * *